US007050155B2

(12) United States Patent
Case et al.

(10) Patent No.: US 7,050,155 B2
(45) Date of Patent: May 23, 2006

(54) ADVANCED EXPOSURE TECHNIQUES FOR PROGRAMMABLE LITHOGRAPHY

(75) Inventors: Andrew Case, Silver Springs, MD (US); Gregory D. Cooper, Alexandria, VA (US); Erin Fleet, Alexandria, VA (US)

(73) Assignee: Pixelligent Technologies LLC, College Park, MD (US)

( * ) Notice: Subject to any disclaimer, the term of this patent is extended or adjusted under 35 U.S.C. 154(b) by 150 days.

(21) Appl. No.: 10/283,322

(22) Filed: Oct. 30, 2002

(65) Prior Publication Data

US 2003/0128347 A1   Jul. 10, 2003

Related U.S. Application Data

(60) Provisional application No. 60/331,515, filed on Nov. 19, 2001, provisional application No. 60/331,039, filed on Nov. 7, 2001, provisional application No. 60/331,038, filed on Nov. 7, 2001, provisional application No. 60/330,765, filed on Oct. 30, 2001, provisional application No. 60/330,745, filed on Oct. 30, 2001.

(51) Int. Cl.
  *G03B 27/32*   (2006.01)
  *G03B 27/42*   (2006.01)
  *G03B 27/54*   (2006.01)

(52) U.S. Cl. .............................. 355/77; 355/53; 355/67
(58) Field of Classification Search .................. 355/53, 355/77, 67; 430/5, 22, 311, 321
See application file for complete search history.

(56) References Cited

U.S. PATENT DOCUMENTS

| 5,418,598 | A | 5/1995 | Fukuda et al. |
| 5,467,166 | A | 11/1995 | Shiraishi |
| 5,527,645 | A | 6/1996 | Pati et al. |
| 5,998,069 | A | 12/1999 | Cutter et al. |
| 6,261,728 | B1 | 7/2001 | Lin |
| 6,291,110 | B1 | 9/2001 | Cooper et al. |
| 6,489,984 | B1 | 12/2002 | Johnson |
| 6,879,376 | B1* | 4/2005 | Case et al. ..................... 355/53 |
| 2005/0036783 | A1* | 2/2005 | Mortia et al. ............... 396/611 |

* cited by examiner

*Primary Examiner*—Rodney Fuller
(74) *Attorney, Agent, or Firm*—Nixon & Vanderhye P.C.

(57) ABSTRACT

Advanced techniques for programmable photolithograhy provide enhanced resolution and other aspects of a photolithography system. The pseudo-inverse of a matrix is applied to the results of a calculation to control exposure energies.

4 Claims, 19 Drawing Sheets

Example stepper system

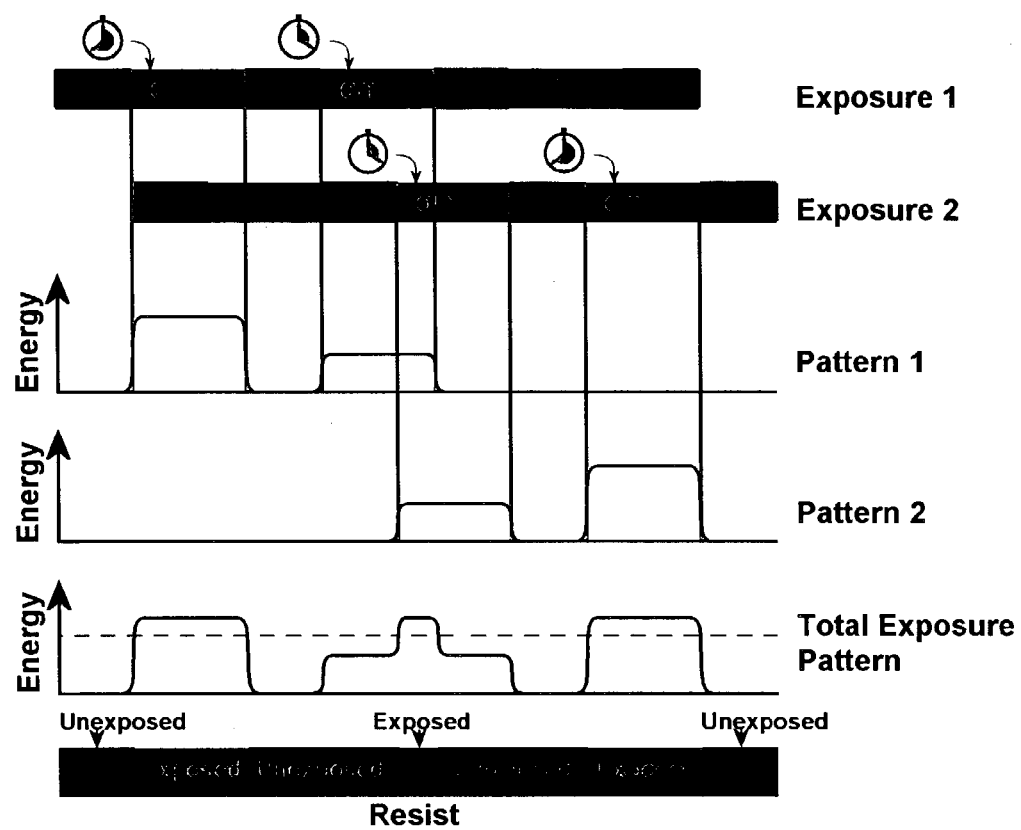
Figure 1 Example Sub-Pixel resolution by exposure overlap

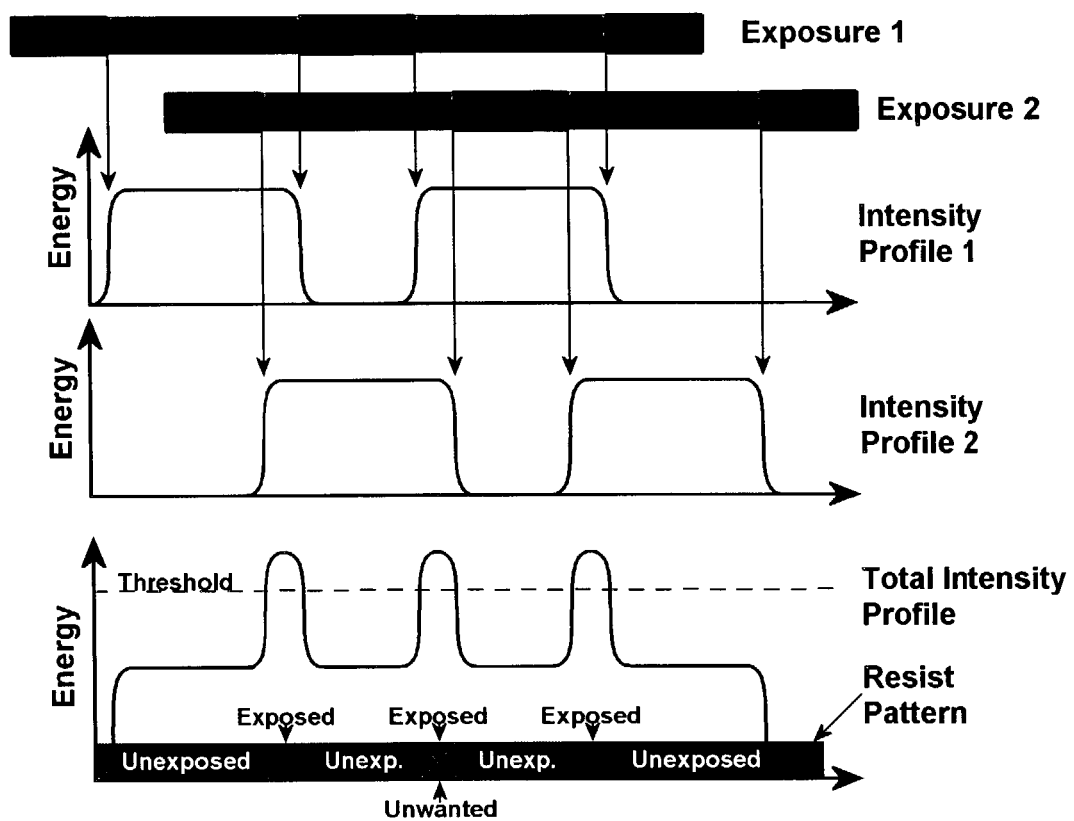
Figure 2 Example Unwanted overlap of single shutter exposure patterns

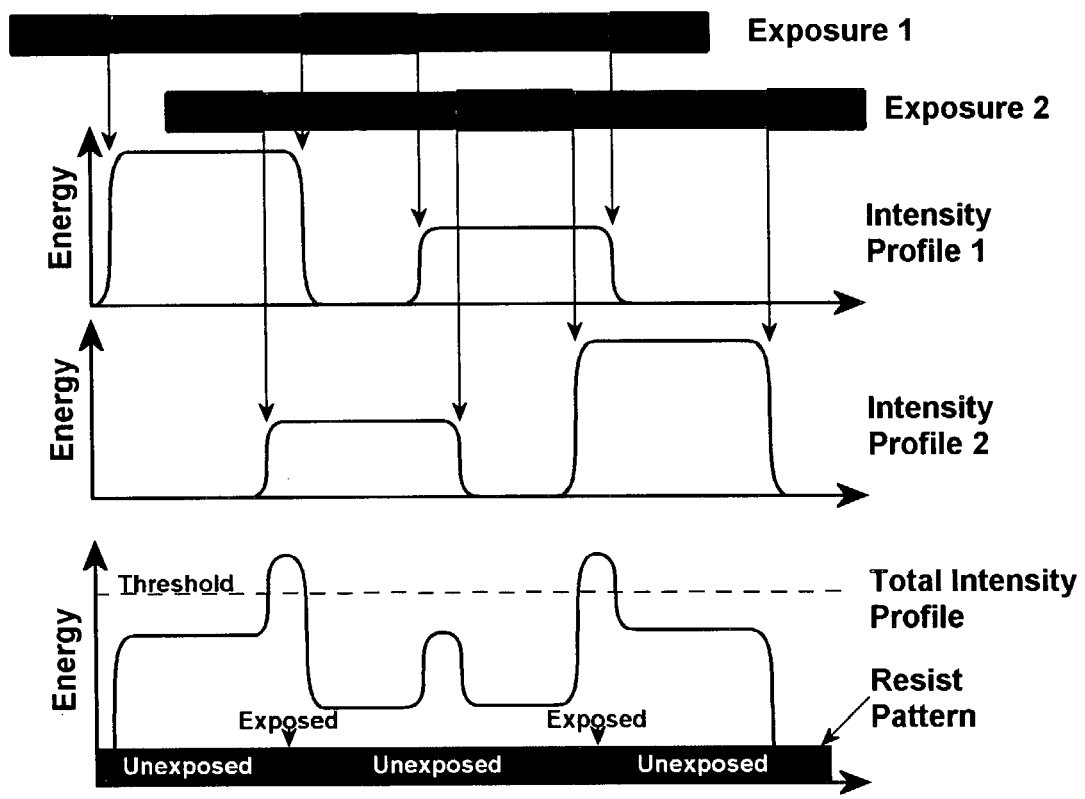
Figure 3 Example Application of timing control to preventing unwanted features

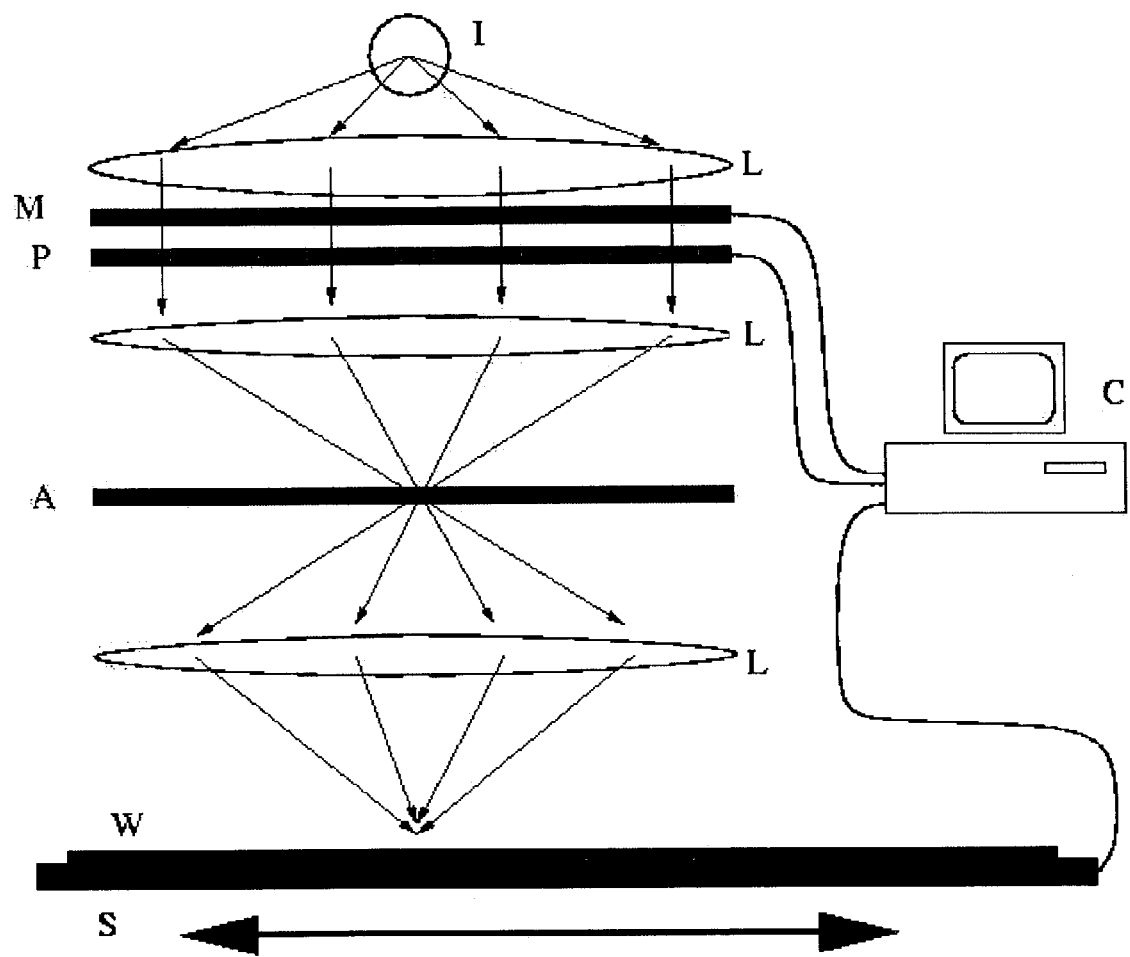
Figure 4 Example stepper system

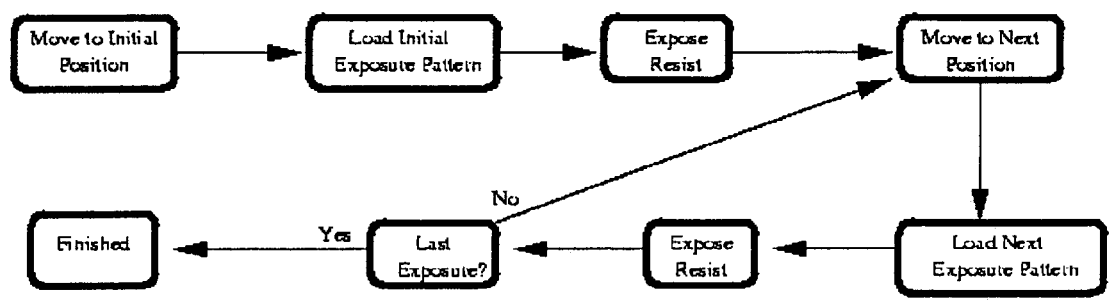
Figure 5 Flowchart of example process used to form resist pattern using multiple exposures and movement of substrate relative to mask

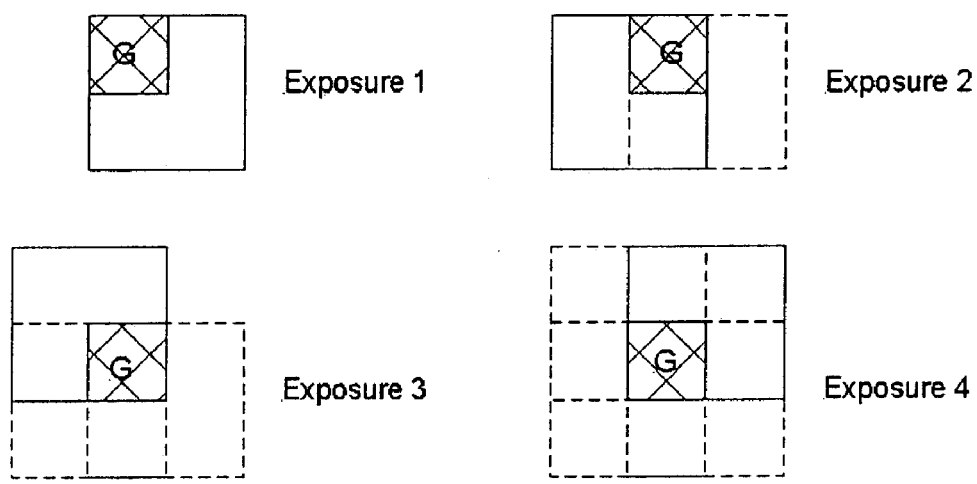
Figure 6A-6D Example Overlap of shutter exposures on a single grid unit

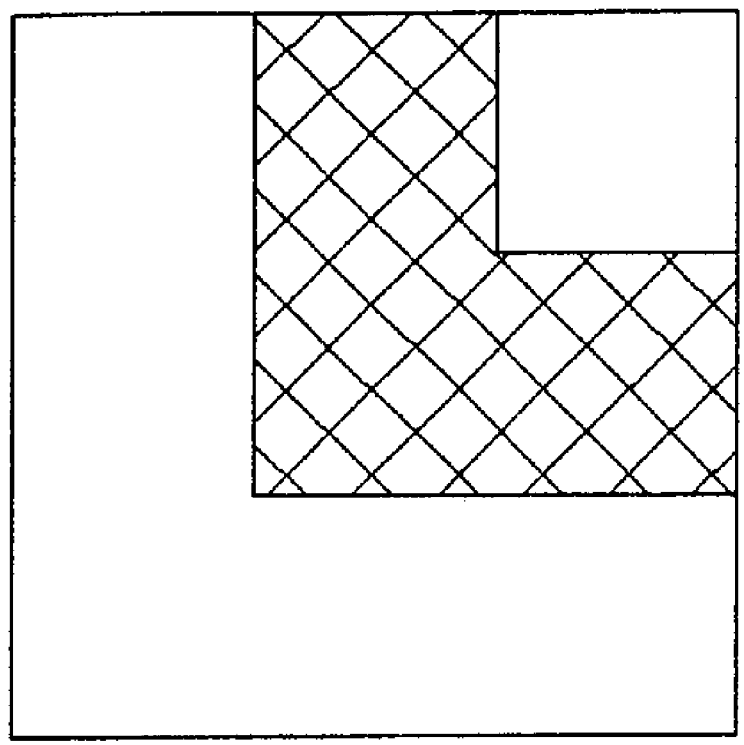
Figure 7 Example Desired exposure pattern

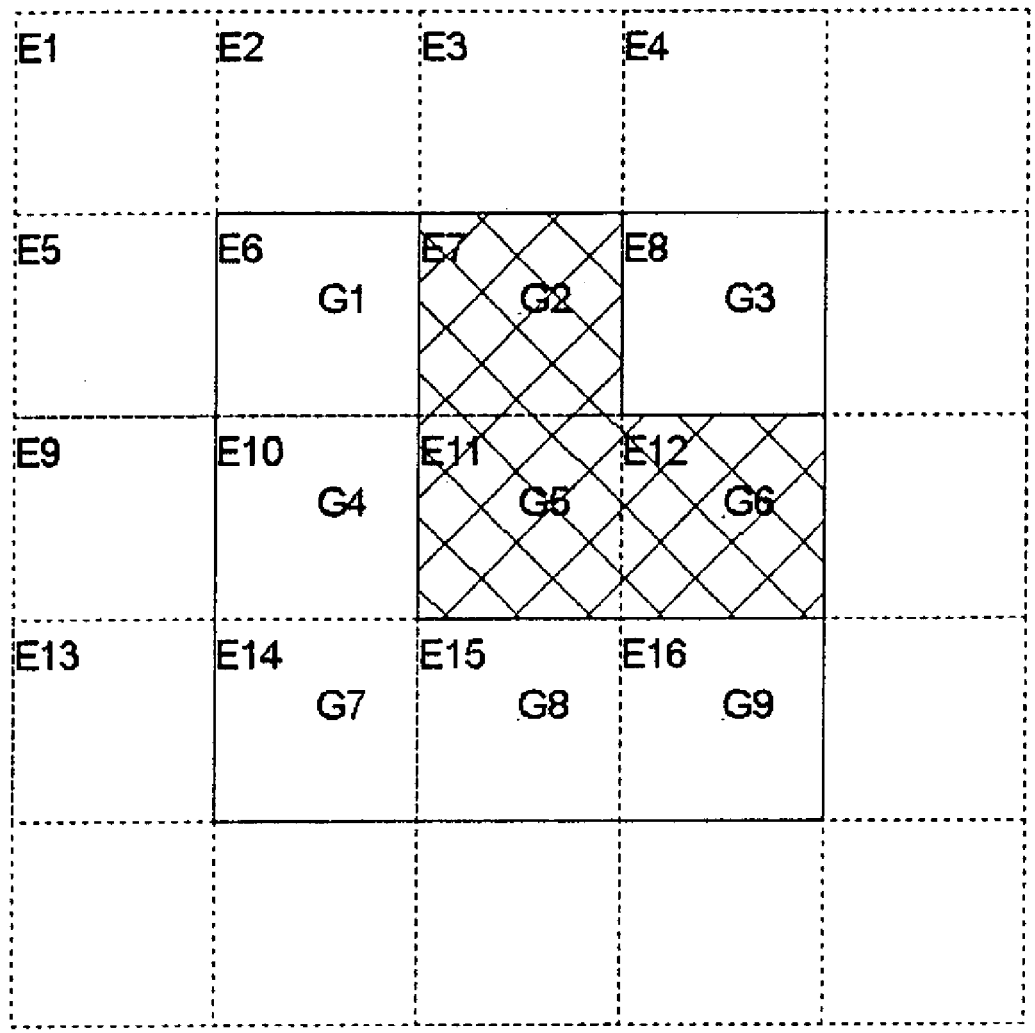
Figure 8 Example Overlap of shutters with grid units

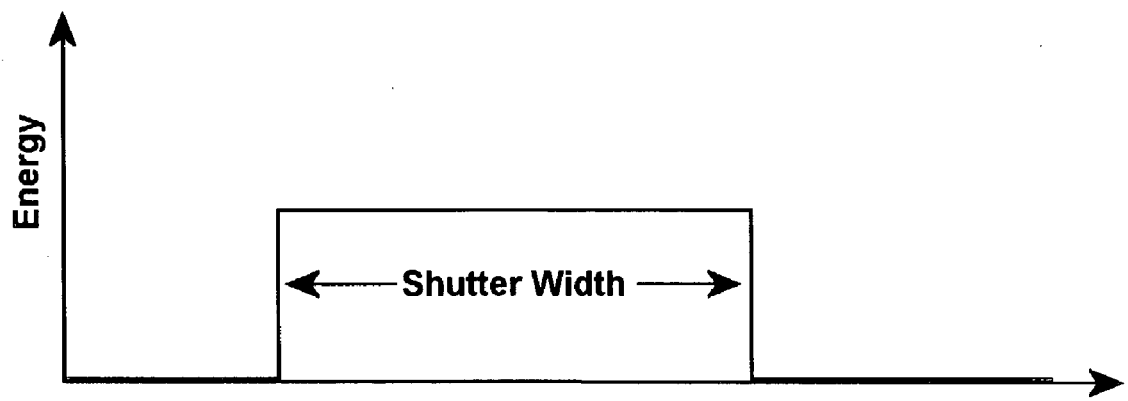
Figure 9 Example Idealized single shutter intensity profile

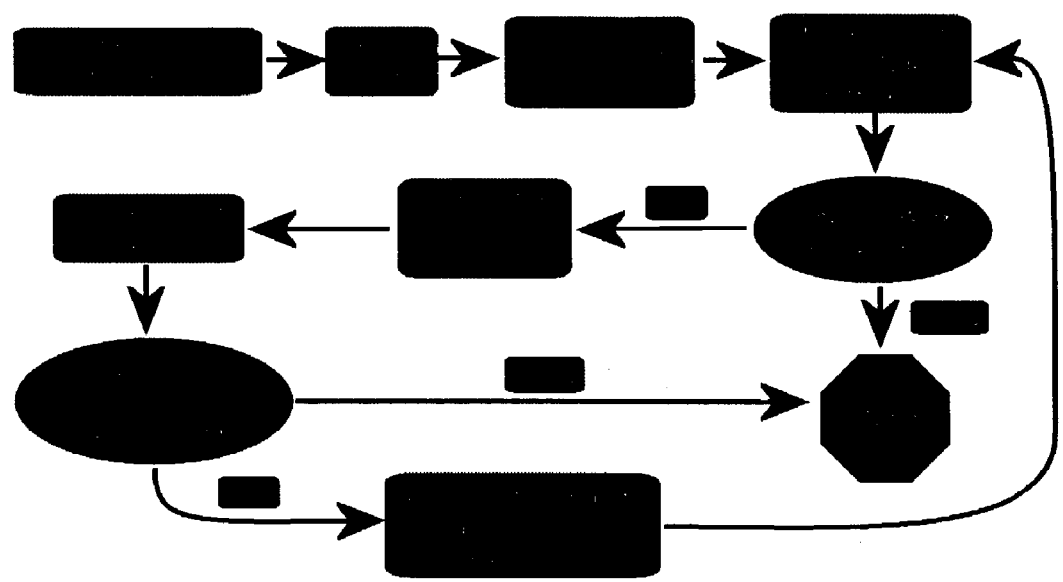
Figure 9A: Exemplary Flowchart

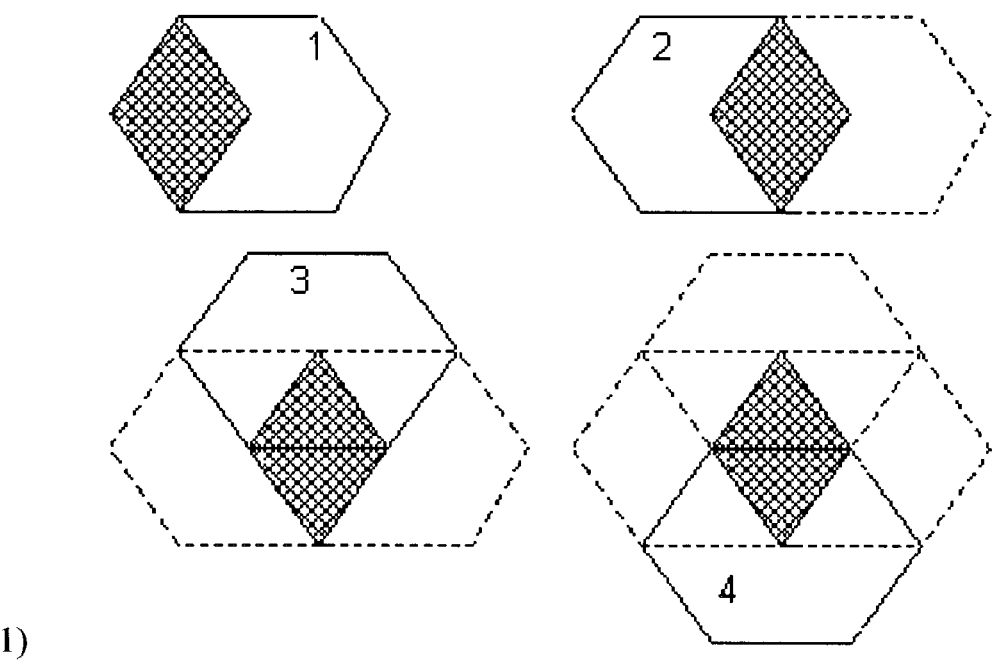
1)
Figure 10 Example Diamond Shaped Grid Units built from Hexagonal Shutters
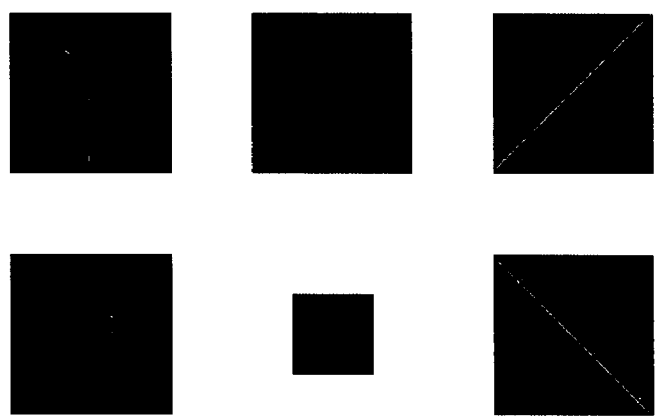
Figure 11 Example Programmable Phase Shift Mask shape library (Blue is bright patches, black is dark; the patterns are on the photoresist).

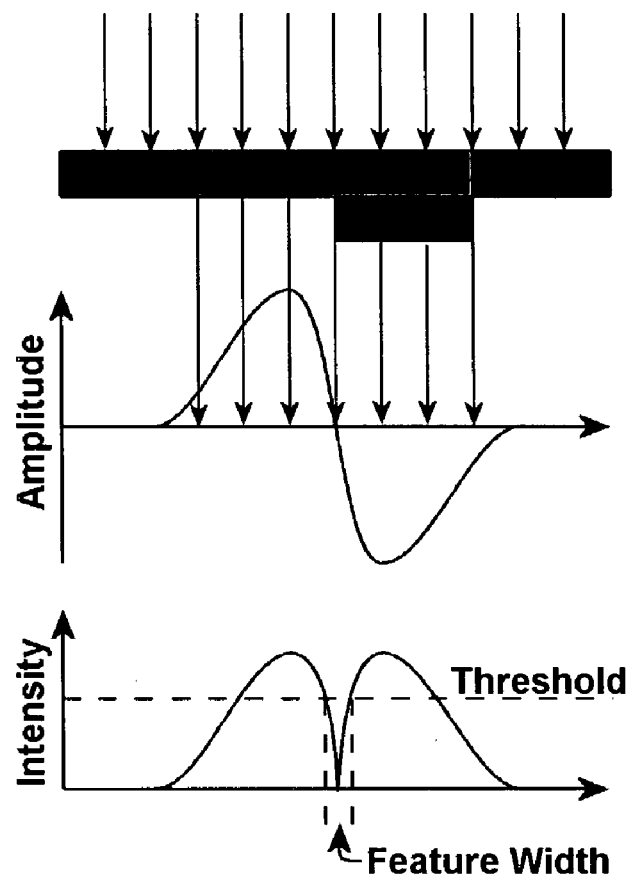
Figure 12 Example creation of narrow features with dark field exposure and phase shifting.

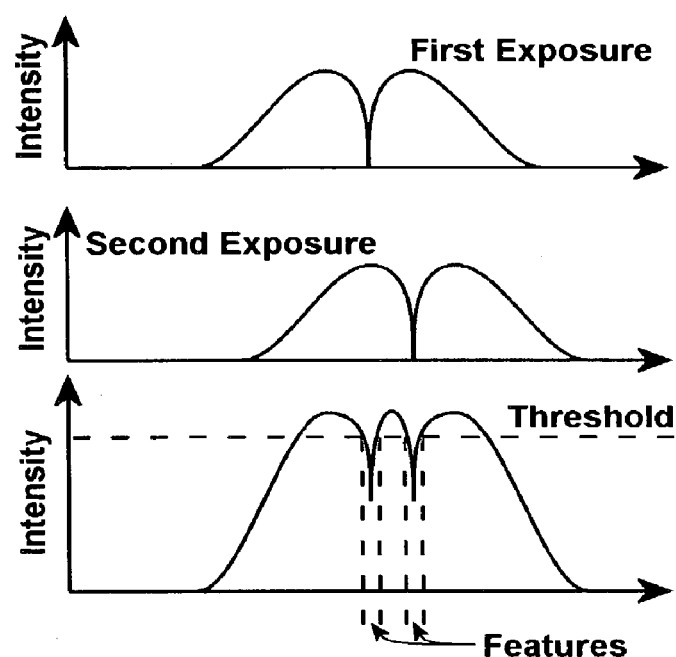
Figure 13 Example Darkfield shutter pattern overlap for resolution enhancement

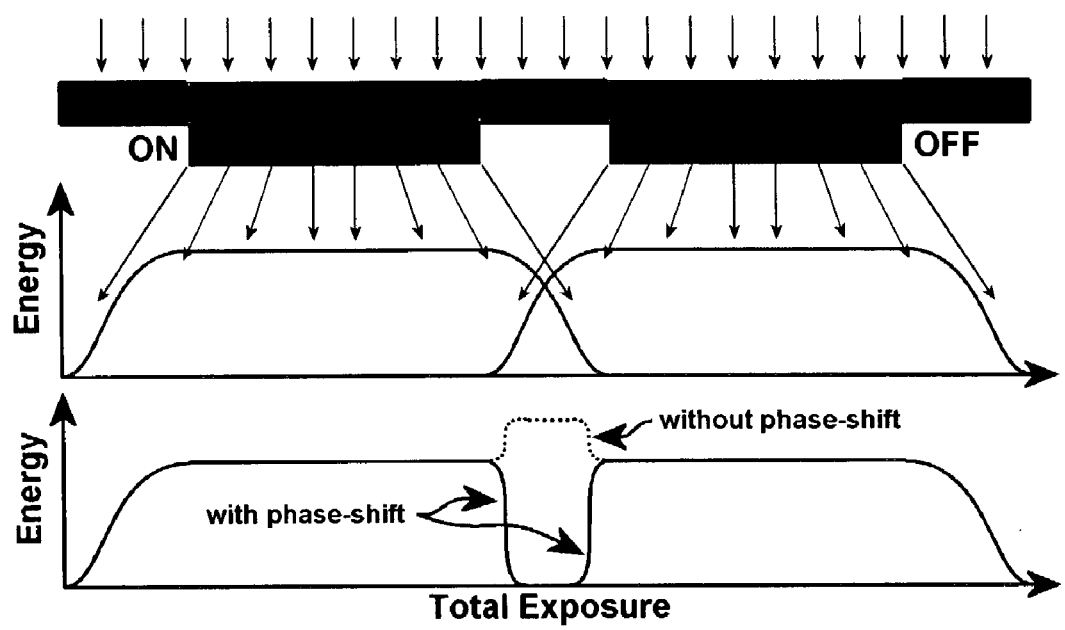
Figure 14 Example Homogeneous programmable phase shifting to adjust the interaction between shutters

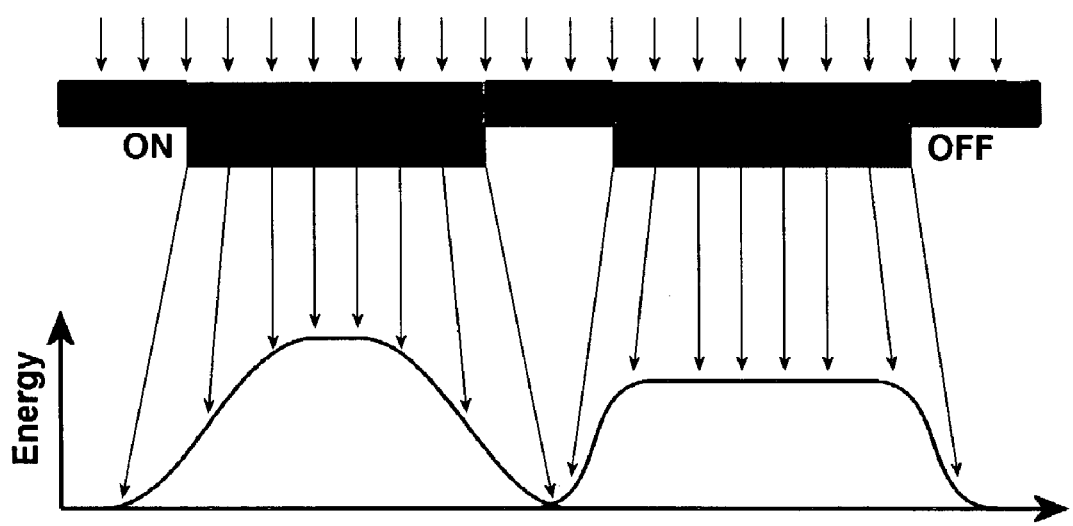
Figure 15 Example Use of Inhomogeneous phase-shifting to adjust individual shutter intensity profiles

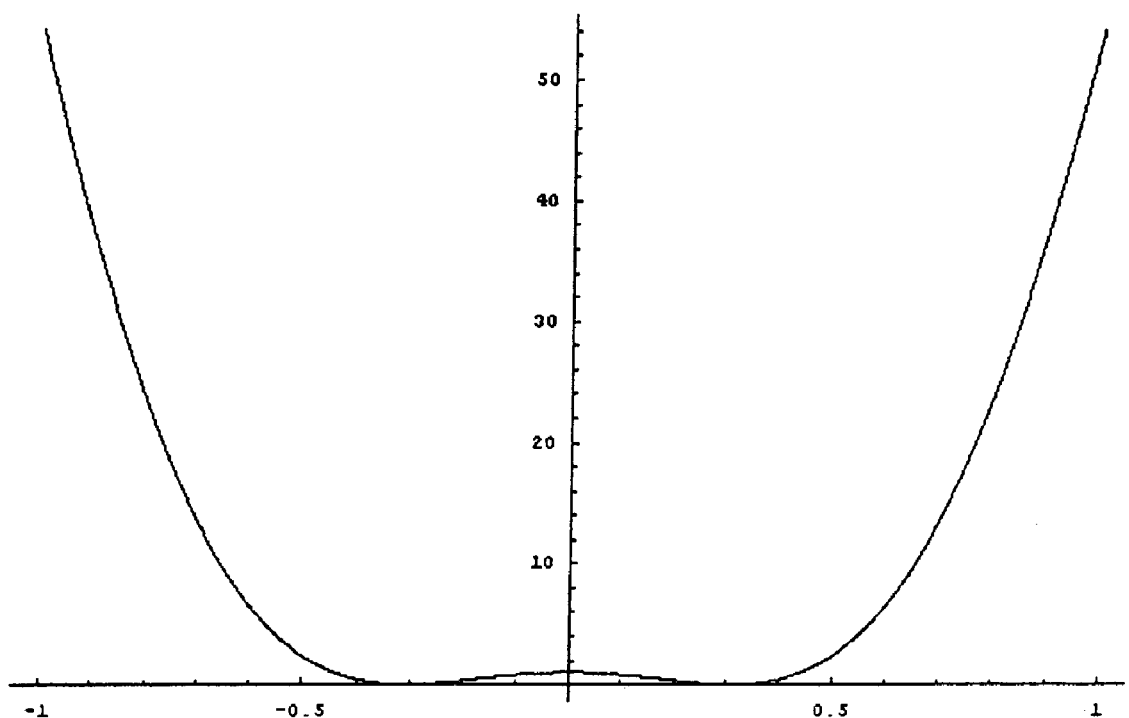
Figure 16 Example Apodized point spread function (X axis is distance in units of wavelength and the y axis is light intensity in arbitrary units)

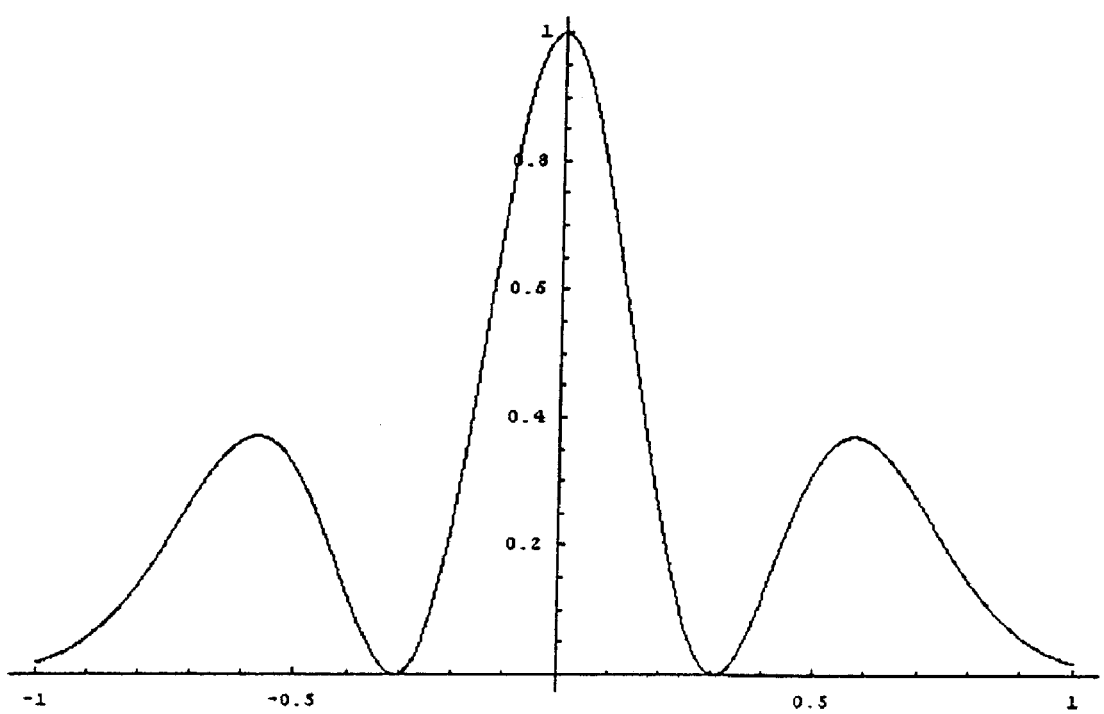
Figure 17 Example Apodized point spread function multiplied by a gaussian of width 1/2 wavelength

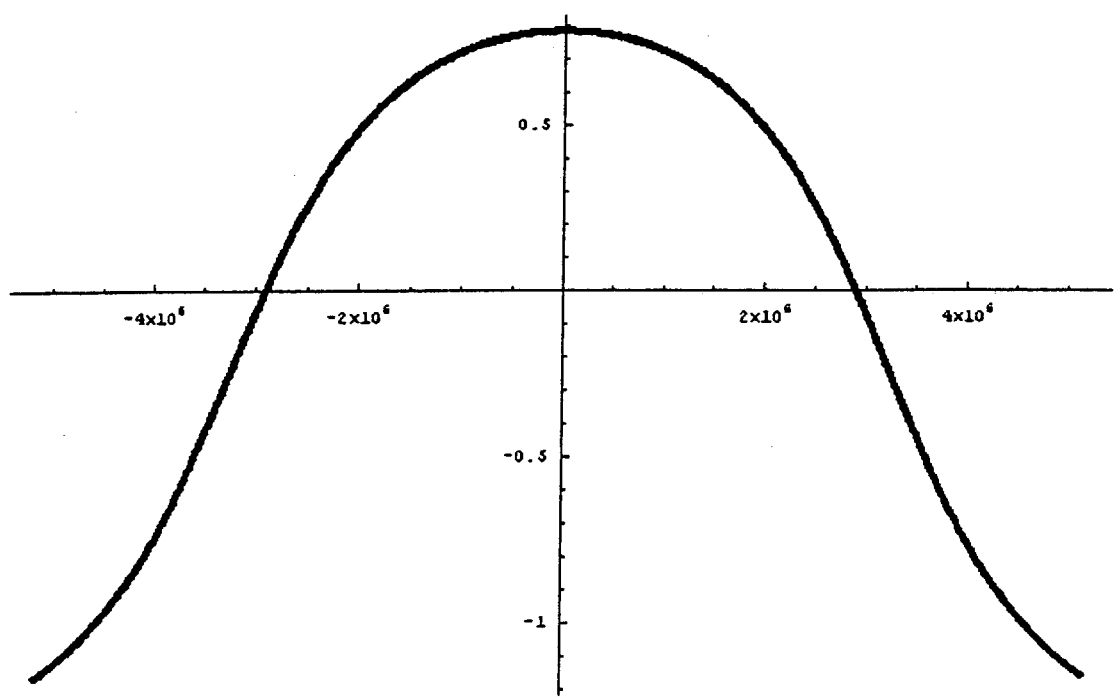
Figure 18 Example Phase shift of apodization pupil (x axis is in units of beta)

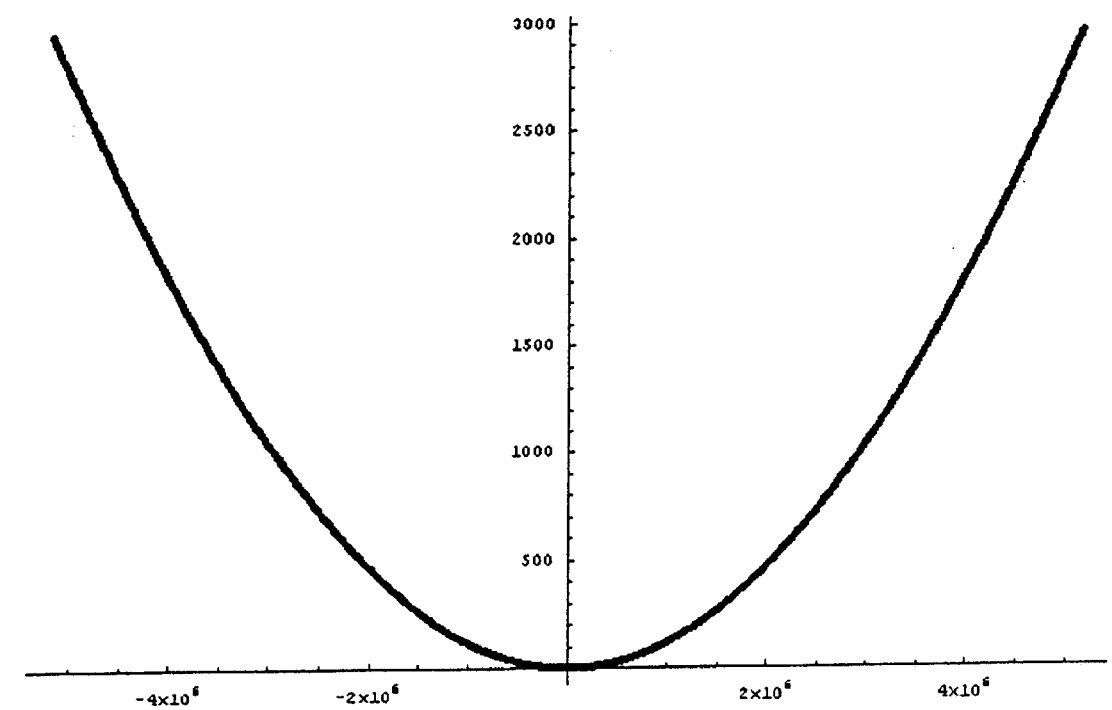
Figure 19 Example Transparency of apodization pupil( X axis is distance in units of beta, y axis is transparency in arbitrary units; In this example the apodization function is dark in the center).

ced features and advantages provided by performing lithography using a programmable mask may be found in the above Cooper et al. U.S. Pat. No. 6,291,110.

ADVANCED EXPOSURE TECHNIQUES FOR PROGRAMMABLE LITHOGRAPHY

CROSS-REFERENCES TO RELATED APPLICATIONS

This application claims priority from the following U.S. provisional patent applications each of which is incorporated by reference herein as if expressly set forth:
- application Ser. No. 60/330,765 filed Oct. 30, 2001 entitled "Pattern Decomposition" (2476-12);
- application Ser. No. 60/330,745 filed Oct. 30, 2001 entitled "Programmable Phase-Shifting" (2476-11);
- application Ser. No. 60/331,038 filed Nov. 7, 2001 entitled "Pattern Decomposition" (2476-19);
- application Ser. No. 60/331,039 filed Nov. 7, 2001 entitled "Programmable Phase-Shifting" (2476-18); and
- application Ser. No. 60/331,515 filed Nov. 19, 2001 entitled "Method and Apparatus For Exposing Photoresists Using Programmable Masks" (2476-15).

This application is also related to commonly-assigned application Ser. No. 09/871,971 to Cooper et al. entitled "Photolithographic System For Exposing A Wafer Using A Programmable Mask" and filed Jun. 4, 2001 (attorney docket 2476-9) incorporated by reference herein.

STATEMENT REGARDING FEDERALLY SPONSORED RESEARCH OR DEVELOPMENT

Not applicable.

FIELD OF THE INVENTION

This invention relates to programmable mask lithography, and more particularly to the use of a programmable mask for exposing a photoresist. In more detail, the invention relates in at least one of its aspects to techniques for building up the desired pattern of resist exposure in a manner which permits the pattern to be created by a sequence of exposures using a programmable mask, including pattern decomposition for exposure using pixel overlap, the use of a shape library of phase shifted pixels, programmable phase shifting of pixels, and/or apodization of pixels.

BACKGROUND AND SUMMARY OF THE INVENTION

By way of general background, lithography is used to transfer a specific pattern onto a surface. Lithography can be used to transfer a variety of patterns including, for example, painting, printing, and the like. More recently, lithographic techniques have become widespread for use in "microfabrication"—a major (but non-limiting) example of which is the manufacture of integrated circuits such as computer chips or semiconductor wafers.

In a typical non-limiting microfabrication operation, lithography is used to define patterns for miniature electrical circuits. Lithography defines a pattern specifying the location of metal, insulators, doped regions, and other features of a circuit printed on a silicon wafer or other substrate. The resulting semiconductor circuit can perform any of a number of different functions. For example, an entire computer can be placed on a chip.

Improvements in lithography have been mainly responsible for the explosive growth of computers in particular and the semiconductor industry in general. The major improvements in lithography are mainly a result of a decrease in the minimum feature size (improvement in resolution). This improvement allows for an increase in the number of transistors on a single chip (and in the speed at which these transistors can operate). For example, the computer circuitry that would have filled an entire room in 1960's technology can now be placed on a silicon "die" the size of a thumbnail. A device the size of a wristwatch can contain more computing power than the largest computers of several decades ago.

One idea to improve lithography performance is to use a programmable mask to expose the substrate. Generally, a programmable mask is a large array of "pixels" that can be individually controlled to either be open (transmit light to the substrate) or be closed (not transmit light to the substrate). There have been several suggested mechanisms for making programmable masks. One is to use liquid crystals to rotate the polarization of light incident on a pixel. In this case only the rotated (or not rotated) polarization would be transmitted to the substrate, and the other polarization would be blocked. Another mechanism for making the pixels is to use mechanical mirrors that can move to either reflect light into or out of the optics of the lithography system. Yet another mechanism is to use electric fields to make semiconductor pixels either transparent or not transparent (pixels made using the semiconductors or liquid crystals can also be referred to as shutters). By individually controlling the shutters, any desired pattern can be easily produced and then easily changed to produce any other pattern. See for example commonly-assigned U.S. Pat. No. 6,291,110 to Cooper et al. entitled "Methods For Transferring A Two-Dimensional Programmable Exposure Pattern For Photolithography" incorporated herein by reference.

Using a programmable mask allows the lithography process to have a high throughput as in conventional parallel lithography since a large number of features are printed in each step. A non-exhaustive list of some of example and illustrative features and advantages provided by performing lithography using a programmable mask may be found in the above Cooper et al. U.S. Pat. No. 6,291,110.

While programmable masks have the potential to fundamentally improve modern photolithography, further improvements are possible and desirable to take better advantage of programmable lithographic techniques and to solve problems related to the use of programmable lithography. We have developed such improvements and enhancements in the following areas:

- pattern decomposition methods and systems that control the shutter opening and closing, and movement of, a programmable mask to create a desired pattern;
- methods and systems that use predetermined phase shifting material on exposure pixels to optimize the basic patterns to be exposed on a semiconductor wafer or other substrate;
- programmable phase-shifting methods and systems that use and control programmable mask shutters to programmably control the phase of photons passing through the mask;
- methods and systems that use apodization to tailor photon distribution at the resist.

These various techniques can be used independently, together in any combination, and/or in combination with other techniques (e.g., photoresist exposure techniques such as disclosed in our copending commonly-assigned application Ser. No. 10/298,224 filed Nov. 18, 2002 now U.S. Pat. No. 6,879,376 based on provisional application No. 60/331,515 filed Nov. 19, 2001), to improve performance such as resolution of programmable photolithography.

For example, one issue that arises is the variability of feature placement and size. In conventional parallel lithography, the feature size and pitch are limited by the smallest achievable intensity profile. However, the features can be placed with an accuracy significantly greater than resolution, and can have an arbitrary size so long as it is larger than the minimum resolution. With a programmable mask, the shutters are spaced at regular intervals so it can be more difficult to place a feature with very high accuracy, or of arbitrary size. Using each shutter in a programmable mask to expose a portion of resist equal in size to the single shutter intensity profile may limit the minimum feature size to the size of the single shutter intensity profile.

One way of dealing with this is to have the exposure system do multiple exposures. In between each exposure, it is possible to move the mask a small amount relative to the wafer. A combination of multiple exposures and movement of the mask relative to the wafer may correct for defective pixels and allow one to choose the location of the feature.

Another way of dealing with feature size limitations due to pixel size and to diffraction limits is to use one (or more) darkfield exposure(s) in combination with programmable lithography, in such a way that the inherent limitations of the darkfield method (excessive space between features) is overcome. This is achieved by overlapping pixel images at the resist in such a way as to create dark regions which are closely spaced, as detailed below.

Yet another approach to improved resolution is to directly modify the single pixel intensity profile (the spatial distribution of energy at the resist due to a single shutter, or pixel) so as to improve the overall flexibility of the programmable lithography system. In certain circumstances it is advantageous to have a steep sided intensity profile, such as in the case where features are created using pixel overlap. In other circumstances it is advantageous to have a peaked intensity profile, such as in the case where feature widths are adjusted by adjusting the amount of time during which light is permitted to fall on the resist (timing control).

Another area in which programmable lithography can be improved is in the case where there is some amount of overlap (due to diffraction) between the light distribution of adjacent shutters. Depending on the pattern being exposed, this may be either desirable or undesirable. In the case where it is desirable, obviously we need do nothing. But in the case where overlap is undesirable, we can compensate for its effects by placing a phase shifting material on one or both shutters, so that the light passing through one shutter is phase-shifted, e.g. by 180 degrees, relative to the light passing through the other shutter. The light in the region of overlap then interferes destructively, reducing the total energy deposited in the overlap region. However, we cannot necessarily predict a priori whether or not we will need to phase-shift a particular set of shutters, since the same mask will be used to expose multiple patterns.

We can solve this problem of arbitrary feature size and placement by, for example, using multiple exposures with local control of the exposure timing, by the use of a phase shifted shape library, by use of pixel-by-pixel programmable phase shift, and by the use of apodization of the limiting aperture of the optical system.

For example, an illustrative method for decomposing a desired resist exposure pattern and using the decomposed pattern to perform programmable lithography involves expressing the desired resist exposure pattern in vector form, and expressing the relationship between the shutter energies and the resulting total energy delivered to the various regions of the resist as a matrix. The pseudo-inverse of the matrix is then calculated, and applied to the desired resist exposure pattern in vector form in order to generate a vector representing the shutter exposure energies. A mask is programmed using the generated shutter exposure energy vector. Electromagnetic energy is then passed through the programmed mask to expose a substrate having resist disposed thereon.

Another example non-limiting method for exposing a resist by use of programmable lithography involves the use of a library of shapes. These shapes can for example be created by the use of phase shifting or other means. The desired pattern of resist exposure is built up by successive exposures of the resist, with possible relative movement of the programmable mask and the wafer between exposures.

A material with changeable refractive index can be applied to the shutters of a programmable mask, or on a separate submask interposed between the programmable mask and the resist, such that the phase of the light from an individual shutter may be programmably changed so as to modify the intensity distribution of light impinging upon the resist.

A material can be applied to the limiting aperture of a lithography system, with specified refractive index and transparency such that the phase and amplitude of the light passing through the limiting aperture are modified so as to create features on the resist smaller than the features created by the system in the absence of said material.

BRIEF DESCRIPTION OF THE DRAWINGS

These and other features and advantages provided in accordance with presently preferred exemplary embodiments of the invention will be better and more completely understood by referring to the following detailed description in connection with the drawings, of which:

FIG. 1 shows exemplary, illustrative sub-pixel resolution by exposure overlap;

FIG. 2 shows example unwanted overlap of single shutter exposure patterns;

FIG. 3 shows exemplary, illustrative application of timing control to prevent unwanted features;

FIG. 4 shows an example illustrative stepper system that implements the FIG. 3 approach;

FIG. 5 shows a flowchart of an example process used to expose a resist using multiple exposures and movement of a substrate relative to a mask;

FIGS. 6A–6D shows example overlap of shutter exposures on a single grid unit;

FIG. 7 shows an example desired exposure pattern;

FIG. 8 shows example overlap of shutters with grid units;

FIG. 9 shows example idealized single shutter intensity profile;

FIG. 9A is a flowchart showing an example pattern decomposition process;

FIG. 10 shows an example of diamond shaped grid units built from hexagonal shutters;

FIG. 11 shows an example illustrative Programmable Phase Shift Mask shape library;

FIG. 12 shows an example use of phase shift in combination with darkfield exposure to create narrow features;

FIG. 13 shows an exemplary Darkfield shutter pattern overlap for resolution enhancement;

FIG. 14 shows an example Homogeneous programmable phase shifting to adjust interaction between shutters;

FIG. 15 shows exemplary illustrative Inhomogeneous phase shifting to adjust individual shutter intensity profiles;

FIG. 16 shows an example illustrative apodized point spread function;

FIG. 17 shows an example illustrative apodized point spread function multiplied by an exemplary Gaussian;

FIG. 18 shows an example phase shift of an illustrative apodization pupil used to produce the apodized point spread function of FIG. 16; and FIG. 19 shows exemplary transparency of the exemplary apodization pupil of FIG. 18.

DETAILED DESCRIPTION OF PRESENTLY PREFERRED EXAMPLE ILLUSTRATIVE EMBODIMENTS

Illustrative Pattern Decomposition Techniques, Methods and Systems

In an illustrative and exemplary embodiment, we use a combination of multiple exposures and movement of the mask relative to the wafer to overlap single shutter exposures to create features smaller than the single shutter intensity profile (sub-pixel resolution). An example process for doing this is illustrated in FIG. 1. We can also avoid the problem of unwanted overlap when we wish to put two sub-pixel features with less than two full single shutter intensity patterns between them, as illustrated in FIG. 2. Our example and illustrative solution is to use the advanced timing adjustment capabilities provided by programmable lithography to modulate the light so that no unwanted features are created, as shown in FIG. 3.

The examples given so far have all been one dimensional. However, the resist pattern we want is inherently two dimensional, so the problem is appreciably more complex, since there is risk of overlap between many more shutter exposures in even the simplest case.

Example Preferred Embodiment Photolithographic System Including Shutter Timing Control to Prevent Unwanted Features FIG. 4 shows an example mass production photolithographic system for exposing substrates such as but not limited to semiconductor wafers having photo-resist thereon. In the example embodiment shown in FIG. 4, a substrate such as a photo-resist coated wafer ("W") is placed on a stage ("S") which is used to move and position the substrate. A source of electromagnetic energy ("I") such as, for example, visible light, x-rays, ultraviolet wavelengths, or other electromagnetic radiation wavelengths appropriate for the particular substrate and exposure processes being performed emits electromagnetic energy. In the example and illustrative embodiment, this electromagnetic energy is passed through a programmable mask ("M") and then through an optical system of lenses and the like ("L") that projects and demagnifies the image of the mask. The optical system may optionally include a programmable phase shifting mask ("P"), which may be separate from the programmable mask or physically part of the programmable mask, and may also optionally include an apodizing mask ("A") may be placed at the limiting aperture of the optical system. The resulting electromagnetic radiation pattern is used to expose a photo-resist coated wafer. A computer ("C") accurately controls the position of the substrate S relative to the exposure pattern by moving and positioning the stage. The computer C also controls the exposure subsystem including the operation of the programmable mask M and the programmable phase shifting mask P.

In the example embodiment, programmable mask M may be of the type described in U.S. Pat. No. 6,291,110 referenced above. Generally, this programmable mask is an array of shutters used to expose a resist or other substrate. Each shutter in the programmable mask M preferred implementation comprises a single light modulating element on the programmable mask. In one example implementation, this single light modulating element may comprise a wide band gap semiconductor with an opacity that may be changed by an applied electric field. However, in other implementations, a shutter may comprise a micromirror, a wide band gap semiconductor in transmission mode or in reflection mode, or any other means of modulating light.

In the example embodiment, the exposure system permits the pattern of electromagnetic radiation to pass through the programmable mask M at a given position. In general, the mask M and/or the substrate S is moved and multiple exposures made in order to create a desired pattern. In the exemplary embodiment, a resist pattern (i.e., the pattern on the photoresist of areas exposed to electromagnetic energy) is formed.

The example and illustrative embodiment controls the intensity profile of the pattern of light that is passed through the mask M to the substrate S. The resulting resist pattern results from selective exposure of areas of the substrate to light intensities above and below a predetermined threshold. Generally, a photo-resist will change its physical and/or chemical properties when it receives electromagnetic energy exposure above a certain intensity threshold. The preferred embodiment takes advantage of this threshold by in some cases providing exposure of the resist while ensuring that in the regions of overlap between pixels, where a feature is wanted, the combined effect of the exposures from the pixels contributing to the overlap region is enough to result in exposure of the resist above the threshold, while in those regions of overlap where no feature is wanted, the combined exposures from the pixels contributing to said region is below the threshold for change in the physical or chemical properties of the resist.

FIG. 5 is a flowchart of an example process used to form a resist pattern using a combination of multiple exposures and movement of the substrate relative to the mask to overlap single shutter exposure to create features smaller than the single shutter intensity profile (i.e., to achieve sub-pixel resolution).

Example Intensity Control Technique

For concreteness, let's look at a specific illustrative but non-limiting example of how computer C determines the programmable configuration of shutters of programmable mask M to achieve sub-pixel resolution. Let the desired resist pattern lie on a 3 by 3 grid, with an L shaped feature to be exposed. We'll assume that the size of the single shutter exposure pattern is twice the size of an individual grid square (side length—four times the area—see FIGS. 6A–6D). An example desired illumination pattern is shown in FIG. 7. The procedure we will follow is this: First we write down a set of equations relating the exposure energies of each shutter at each mask location to the resulting total light intensity at each grid location. Then we try to solve the resulting set of simultaneous equations for the exposure energies in terms of the desired resist pattern.

Since we have 9 grid units in this example, we will have 9 equations, each with 4 unknowns (for each of the 4 exposures per grid unit). Example overlap of shutters with grid units is shown in FIG. 8 where the shutters are indicated by $E_x$ in the upper left corner, and the grid squares are indicated by $G_x$ near the center. Note that since there are 4 grid units per shutter, the edges of the shutters extend one grid unit past the edge of the desired resist pattern on all sides.

The resulting set of coupled equations for the grid unit exposures is $$E_1+E_2+E_5+E_6=G_1$$

$$E_2+E_3+E_6+E_7=G_2$$

$$E_3+E_4+E_7+E_8=G_3$$

$$E_5+E_6+E_9+E_{10}=G_4$$

$$E_6+E_7+E_{10}+E_{11}=G_5$$

$$E_7+E_8+E_{11}+E_{12}=G_6$$

$$E_9+E_{10}+E_{13}+E_{14}=G_7$$

$$E_{10}+E_{11}+E_{14}+E_{15}=G_8$$

$$E_{11}+E_{12}+E_{15}+E_{16}=G_9$$

From the grid unit exposure equations we can construct the matrix equation:

$$\begin{pmatrix} 1 & 1 & 0 & 0 & 1 & 1 & 0 & 0 & 0 & 0 & 0 & 0 & 0 & 0 & 0 & 0 \\ 0 & 1 & 1 & 0 & 0 & 1 & 1 & 0 & 0 & 0 & 0 & 0 & 0 & 0 & 0 & 0 \\ 0 & 0 & 1 & 1 & 0 & 0 & 1 & 1 & 0 & 0 & 0 & 0 & 0 & 0 & 0 & 0 \\ 0 & 0 & 0 & 0 & 1 & 1 & 0 & 0 & 1 & 1 & 0 & 0 & 0 & 0 & 0 & 0 \\ 0 & 0 & 0 & 0 & 0 & 1 & 1 & 0 & 0 & 1 & 1 & 0 & 0 & 0 & 0 & 0 \\ 0 & 0 & 0 & 0 & 0 & 0 & 1 & 1 & 0 & 0 & 1 & 1 & 0 & 0 & 0 & 0 \\ 0 & 0 & 0 & 0 & 0 & 0 & 0 & 0 & 1 & 1 & 0 & 0 & 1 & 1 & 0 & 0 \\ 0 & 0 & 0 & 0 & 0 & 0 & 0 & 0 & 0 & 1 & 1 & 0 & 0 & 1 & 1 & 0 \\ 0 & 0 & 0 & 0 & 0 & 0 & 0 & 0 & 0 & 0 & 1 & 1 & 0 & 0 & 1 & 1 \end{pmatrix} \begin{pmatrix} E_1 \\ E_2 \\ E_3 \\ E_4 \\ E_5 \\ E_6 \\ E_7 \\ E_8 \\ E_9 \\ E_{10} \\ E_{11} \\ E_{12} \\ E_{13} \\ E_{14} \\ E_{15} \\ E_{16} \end{pmatrix} = \begin{pmatrix} G_1 \\ G_2 \\ G_3 \\ G_4 \\ G_5 \\ G_6 \\ G_7 \\ G_8 \\ G_9 \end{pmatrix}$$

which can be written in more compact form as $$\tilde{A} \cdot \vec{E} = \vec{G}$$

By means discussed in the next section, we construct a matrix, $\tilde{X}$:

$$\tilde{X} = \begin{pmatrix} \frac{9}{16} & \frac{-3}{8} & \frac{3}{16} & \frac{-3}{8} & \frac{1}{4} & \frac{-1}{8} & \frac{3}{16} & \frac{-1}{8} & \frac{1}{16} \\ \frac{3}{16} & \frac{3}{8} & \frac{-3}{16} & \frac{-1}{8} & \frac{-1}{4} & \frac{1}{8} & \frac{1}{16} & \frac{1}{8} & \frac{-1}{16} \\ \frac{-3}{16} & \frac{3}{8} & \frac{3}{16} & \frac{1}{8} & \frac{-1}{4} & \frac{-1}{8} & \frac{-1}{16} & \frac{1}{8} & \frac{1}{16} \\ \frac{3}{16} & \frac{-3}{8} & \frac{9}{16} & \frac{-1}{8} & \frac{1}{4} & \frac{-3}{8} & \frac{1}{16} & \frac{-1}{8} & \frac{3}{16} \\ \frac{3}{16} & \frac{-1}{8} & \frac{1}{16} & \frac{3}{8} & \frac{-1}{4} & \frac{1}{8} & \frac{-3}{16} & \frac{1}{8} & \frac{-1}{16} \\ \frac{1}{16} & \frac{1}{8} & \frac{-1}{16} & \frac{1}{8} & \frac{1}{4} & \frac{-1}{8} & \frac{-1}{16} & \frac{-1}{8} & \frac{1}{16} \\ \frac{-1}{16} & \frac{1}{8} & \frac{1}{16} & \frac{-1}{8} & \frac{1}{4} & \frac{1}{8} & \frac{1}{16} & \frac{-1}{8} & \frac{-1}{16} \\ \frac{1}{16} & \frac{-1}{8} & \frac{3}{16} & \frac{1}{8} & \frac{-1}{4} & \frac{3}{8} & \frac{1}{16} & \frac{1}{8} & \frac{-3}{16} \\ \frac{-3}{16} & \frac{1}{8} & \frac{-1}{16} & \frac{3}{8} & \frac{-1}{4} & \frac{1}{8} & \frac{3}{16} & \frac{-1}{8} & \frac{1}{16} \\ \frac{-1}{16} & \frac{-1}{8} & \frac{1}{16} & \frac{1}{8} & \frac{1}{4} & \frac{-1}{8} & \frac{1}{16} & \frac{1}{8} & \frac{-1}{16} \\ \frac{1}{16} & \frac{-1}{8} & \frac{-1}{16} & \frac{-1}{8} & \frac{1}{4} & \frac{1}{8} & \frac{-1}{16} & \frac{1}{8} & \frac{1}{16} \\ \frac{-1}{16} & \frac{1}{8} & \frac{-3}{16} & \frac{1}{8} & \frac{-1}{4} & \frac{3}{8} & \frac{1}{16} & \frac{-1}{8} & \frac{3}{16} \\ \frac{3}{16} & \frac{-1}{8} & \frac{1}{16} & \frac{-3}{8} & \frac{1}{4} & \frac{-1}{8} & \frac{9}{16} & \frac{-3}{8} & \frac{3}{16} \\ \frac{1}{16} & \frac{1}{8} & \frac{-1}{16} & \frac{-1}{8} & \frac{-1}{4} & \frac{1}{8} & \frac{3}{16} & \frac{3}{8} & \frac{-3}{16} \\ \frac{-1}{16} & \frac{1}{8} & \frac{1}{16} & \frac{1}{8} & \frac{-1}{4} & \frac{-1}{8} & \frac{-3}{16} & \frac{3}{8} & \frac{3}{16} \\ \frac{1}{16} & \frac{-1}{8} & \frac{3}{16} & \frac{-1}{8} & \frac{1}{4} & \frac{-3}{8} & \frac{3}{16} & \frac{-3}{8} & \frac{9}{16} \end{pmatrix}$$

so that $$\tilde{A} \cdot \tilde{X} = \begin{pmatrix} 1 & 0 & 0 & 0 & 0 & 0 & 0 & 0 & 0 \\ 0 & 1 & 0 & 0 & 0 & 0 & 0 & 0 & 0 \\ 0 & 0 & 1 & 0 & 0 & 0 & 0 & 0 & 0 \\ 0 & 0 & 0 & 1 & 0 & 0 & 0 & 0 & 0 \\ 0 & 0 & 0 & 0 & 1 & 0 & 0 & 0 & 0 \\ 0 & 0 & 0 & 0 & 0 & 1 & 0 & 0 & 0 \\ 0 & 0 & 0 & 0 & 0 & 0 & 1 & 0 & 0 \\ 0 & 0 & 0 & 0 & 0 & 0 & 0 & 1 & 0 \\ 0 & 0 & 0 & 0 & 0 & 0 & 0 & 0 & 1 \end{pmatrix} = \tilde{I}_{9 \times 9}$$

Now we need to come up with some numbers: let the exposed grid elements ($G_2$, $G_5$, $G_6$) have a target exposure value of 1.2 (taking 1 a the threshold) and assign all the others a value of 0.6. Multiplying $\vec{G}$ by $\tilde{X}$ we obtain an estimate for $\vec{E}$ (why this works will be clarified below).

$$\begin{pmatrix} E_1 \\ E_2 \\ E_3 \\ E_4 \\ E_5 \\ E_6 \\ E_7 \\ E_8 \\ E_9 \\ E_{10} \\ E_{11} \\ E_{12} \\ E_{13} \\ E_{14} \\ E_{15} \\ E_{16} \end{pmatrix} = \begin{pmatrix} 0 \\ 0.3 \\ 0.15 \\ -0.15 \\ 0 \\ 0.3 \\ 0.45 \\ 0.15 \\ 0.15 \\ 0.15 \\ 0.3 \\ 0.3 \\ 0.15 \\ 0.15 \\ 0 \\ 0 \end{pmatrix}$$

where values smaller than $10^{-15}$ have been rounded to 0.

Obviously $E_4 = -0.15$ is unacceptable, since it means we have a negative exposure energy, which is impossible. Since we don't care about details of grid element exposure (the numbers chosen earlier were only for concreteness, so we could calculate exposure values), only whether it is above or below threshold we can simply set the offending element to zero, calculate the grid exposure, and see if the result is satisfactory. Setting $E_4 = 0$ and carrying out the matrix multiplication, we find $$\begin{pmatrix} G_1 \\ G_2 \\ G_3 \\ G_4 \\ G_5 \\ G_6 \\ G_7 \\ G_8 \\ G_9 \end{pmatrix} = \begin{pmatrix} 0.6 \\ 1.2 \\ 0.75 \\ 0.6 \\ 1.2 \\ 1.2 \\ 0.6 \\ 0.6 \\ 0.6 \end{pmatrix}$$

which is perfectly acceptable as an exposure pattern. The only change is that the exposure of the $G_3$ grid square is now 0.75 instead of 0.6, which is still comfortably below threshold. In the event that we need finer control (imperfect resists and diffracted exposure patterns), this may not be acceptable, in which case we would have to turn to tweaking by a more refined technique such as a genetic algorithm based optimization, or some similarly sophisticated technique.

Example Technique for Setting up the Solution

We start with a desired pattern to be projected onto a resist using a programmable mask. For now we make the following assumptions:

1. The shutters are square, of side length w
2. The desired pattern lies on a square grid consisting of square grid units (like the squares on a sheet of graph paper) of side length d. Grid units may be either exposed or not exposed, thus creating the pattern.
3. There are an integer number grid units per shutter, so that n×n grid units make up one shutter (in the example above n=2).
4. The shutters have an ideal intensity profile, that is, vertical sides, no light outside the illuminated area, and uniform illumination inside (see FIG. 9).
5. The resist has an ideal response curve, that is, for total exposure doses below some threshold energy T, the resist is completely unaffected, and above T the resist undergoes a discontinuous change in properties from unexposed to exposed.
6. The mask may be aligned to the wafer in successive steps with arbitrary precision.

These requirements are imposed purely to simplify the presentation of the technique in an illustrative, non-limiting example. They may be relaxed or changed in different contexts depending on requirements. Further discussion of the effect of relaxing these assumptions is set forth below in this document.

The process of exposing the desired pattern involves moving the mask to an initial position, opening the shutters for the appropriate time (or number of pulses of the light source if pulsed), and then moving to the next position and repeating the process. In each step each shutter may be open for a different amount of time, independent of what neighboring shutters are doing, so that the exposure dose is controlled shutter by shutter. It is this individual shutter exposure dose that we wish to calculate, based on the desired resist pattern.

Example Technique for Finding Exposure Values

In order to find the desired value of the individual shutter energies at each mask position, we start by assigning a variable to each such energy: $E_1, E_2, \ldots, E_q$. Next we apply the constraints—for each grid square, let the desired total energy be G, so that we have a set $G_1, G_2, \ldots, G_m$, where m is the total number of grid squares. FIG. 8 shows an example relation between a set of shutters and the underlying grid, showing that a given grid square is exposed by multiple shutters, and a given shutter exposes multiple grid units, leading to a set of coupled equations:

$$A_{11}E_1 + A_{12}E_2 + \ldots + A_{1q}E_q = G_1 \quad (1)$$
$$\vdots$$
$$A_{m1}E_1 + A_{m2}E_2 + \ldots + A_{mq}E_q = G_m$$

where the coefficients $A_{xy}$ have the value 1 if the corresponding exposure value $E_y$ contributes to the resist exposure $G_x$ and have the value 0 otherwise.

This set of coupled equations may be solved using the technique of matrix inversion (though note that at this point we have not assigned any values to the grid exposure variables G). We may write the equations in matrix form as $$\tilde{A} \cdot \vec{E} = \vec{G}$$

with solution $$\vec{E} = \tilde{A}^{-1} \cdot \vec{G}$$

where $\tilde{A}$ is a matrix of ones and zeros placed according to equations (1). However: unless $\tilde{A}$ is square (i.e. m=q) the matrix $\tilde{A}^{-1}$ does not exist. Since in general $\tilde{A}$ is not square, we need to come up with an alternative technique. The technique we need involves the generalized inverse, a matrix, $\tilde{X}$, which satisfies $$\tilde{A} \cdot \tilde{X} \cdot \tilde{A} = \tilde{A}$$

The generalized inverse is also known as the pseudo-inverse, semi-inverse, reciprocal inverse, reflexive generalized inverse, normalized generalized inverse, weak generalized inverse, general reciprocal, generalized inverse, and Moore-Penrose inverse—some of these names refer to more restrictive subsets of the matrix we want, but all include it.

Given such an matrix, if we have $$\tilde{A} \cdot \tilde{X} \cdot \vec{G} = \vec{G}$$

then the general solution for the shutter exposure energies is $$\vec{E} = \tilde{X} \cdot \vec{G} + (\tilde{I} - \tilde{X} \cdot \tilde{A}) \cdot \vec{T}$$

where $\tilde{I}$ is the identity matrix and $\vec{T}$ is an arbitrary vector. The freedom we have due to the fact that our system of equations is underdetermined is embodied in $\vec{T}$, which allows us to tweak the solution to ensure that all shutter energies are positive, and to meet additional constrains we may impose on the system.

The matrix $\tilde{X}$ may be found using well known techniques (for example, the Mathematica function PseudoInverse[] calculates $\tilde{X}$ given $\tilde{A}$). This leaves the condition that $$\tilde{A} \cdot \tilde{X} \cdot \vec{G} = \vec{G}$$

This condition is satisfied if $\vec{G}$ is an eigenvector of $\tilde{M} = \tilde{A} \cdot \tilde{X}$ with eigenvalue 1. Fortunately, $\tilde{M}$ is idempotent, so it has only two eigenvalues, 1 and 0, and the eigenspace of the unit eigenvalue is the column space of $\tilde{M}$. This allows us to easily assess whether or not we can create the whole desired pattern in a single set of exposures, or whether we need to do one set of exposures, etch, reapply resist, and expose the remainder of the pattern. Assuming we find $\tilde{X}$ by known methods, we calculate $\tilde{M}$, and project $\vec{G}$ onto the rowspace of $\tilde{M}$. If we find that $\vec{G}$ is in the rowspace of $\tilde{M}$, then we know we can create the desired pattern in a single set of exposures. We then use the freedom offered by $\vec{T}$ to tweak the shutter energies to optimize the resist exposure pattern (and to ensure that all shutter energies are positive). If $\vec{G}$ is not in the rowspace of $\tilde{M}$, then we will need multiple expose/etch cycles. The only caveat is that if we cannot ensure that all exposure energies are positive by using the freedom given by $\vec{T}$, or by adjusting the values in $\vec{G}$, then we will need to break the pattern down further.

The matrix $\tilde{A}$ may be very large (on the order of $10^{10}$ elements), so inversion by non-optimized techniques is likely to take too long to be of any practical use. Fortunately, $\tilde{A}$ is sparse, and there is regularity in the ordering of the nonzero elements, so fast inversion routines may be used which yield a result quickly. In addition, due to the fact that the exposure pattern will probably require some tweaking after initial determination of the pattern, we can use approximate methods for inversion, leading to still greater reductions in time required to compute the generalized inverse. Fast routines for finding the pseudo inverse based on regularities in the matrix being inverted are known, as are fast routines for finding approximations to the pseudo inverse.

Finally, some comments on the nature of $\tilde{T}$—this is the vector that permits tweaking of the solution: In practice, the thing we add to the solution in our exemplary embodiment is not $\tilde{T}$, but $(\tilde{I} - \tilde{A} \cdot \tilde{X}) \cdot \tilde{T}$. This vector has no effect on the derived values for $\vec{E}$ because it lies in the null space of the operator $\tilde{A}$. The operator $(\tilde{I} - \tilde{A} \cdot \tilde{X})$ projects any vector into the null space of $\tilde{A}$. With this observation, we can simplify the equation for a solution to $\vec{E} = \tilde{X} \cdot \vec{G} + \vec{T}_{N(A)}$, where $\vec{T}_{N(A)}$ is any vector lying in the null space of $\tilde{A}$. Using standard techniques we can calculate a set of vectors spanning the null space of $\tilde{A}$, and therefore construct a basis for $\tilde{T}_{N(A)}$. It is entirely possible that our pseudo inverse is such that there is no null space (i.e. $\tilde{A} \cdot \tilde{X} = \tilde{I}$), in which case we have to turn to other methods of tweaking the exposure values, such as adjusting the grid pattern vector $\vec{G}$ for example.

Example Pattern Decomposition Process

FIG. 9A shows an example pattern decomposition process provided by a presently preferred illustrative but non-limiting embodiment of the present invention. In the FIG. 9A example, a shutter-grid map matrix A is constructed (block 202) and inverted to obtain X as discussed above (block 204). A desired grid exposure vector G is then built based upon the X matrix (block 206). The shutter energy required to obtain vector E is found (block 208) and is checked for physical realizability (block 210). If the energy vector E is physically realizable (no negative in values), then the process is then complete (block 212). Otherwise, negative values in the vector E are set to 0 (block 214) and new grid exposure values are found (block 216) and tested against required limits (block 218). A modified target and exposure vector G' is constructed (block 220) and used to determine a new required shutter energy vector E (block 208). This process may iterate as many times as is necessary to obtain a physically realizable energy vector E (blocks 210–220).

Example Relaxation of Illustrative Constraints

We now return to the assumptions made at the beginning and examine how relaxing them affects the technique presented above. Examining each assumption in order:

1) The shutters need not be square. Round shutters might be used, but the overlap pattern would be harder to calculate. Shutters could potentially be hexagonal, on an underlying triangular grid, or triangular on a triangular grid, an example is given in FIG. 10. Each possible exposure location has, in one example arrangement, a unique identifier ($E_1$, $E_2$, . . . above), and each grid square has a unique identifier ($G_1$, $G_2$, . . . above). The identifiers need not be in any particular order, though considerable simplification may be achieved by ordering the identifiers in a manner that reflects the structure of the grid and the pattern of the exposures.

2) The grid need not be square, as suggested above. The grid need not even tile the plane, as long as the regions not covered are generally not important. For example, the grid could consist of circles with some space between them, as long as we do not care whether the resist between the circles is exposed or not.

3) We must have an integer number of grid units per shutter in order to be able to construct the equations describing the relation between shutters and grid units. The large flexibility in choosing the grid, however, allows us to compensate for this.

4) A non-ideal intensity profile (for example, due to diffraction) may introduce some uncertainty into the exact location of the edges of exposed regions. However, the location of the edge can be calculated from knowledge of the intensity profile. The freedom embodied in $\vec{T}$ may then be used to adjust the location of the edge so that the ideal edge location is achieved.

In addition, the diffraction pattern may be used to precisely locate the edges of exposed regions with a precision greater than the grid spacing, allowing for features which are not an integral number of grid units in width. One possible approach is to use the technique outlined here to create an initial guess, and then use the freedom embodied in $\vec{T}$ to optimize the pattern based on the known non-ideal intensity profile by use of genetic algorithms or some other method. In addition, the resist exposure pattern may be tweaked by directly adjusting individual shutter energies, as done in the example.

5) The resist need not have an ideal response curve. The non-ideality may be taken into account in the analysis of the uncertainties of feature sizes, and therefore compensated for using the flexibility in $\vec{T}$.

6) The mask alignment need not be arbitrarily precise. Imprecision in mask alignment will be reflected in imprecision in feature size.

Example Wavefront Engineering

The technique of wavefront engineering provides for closer control of the light intensity pattern at the resist surface. This precise control is attained by selectively shifting the phase of the light and correcting for proximity effects so as to improve depth of focus and reduce feature size.

The light passing through a clear area of the mask will spread out due to diffraction as it passes through the optical system to the resist. The limit on the separation of adjacent features due to diffraction is given by the lithographer's equation $$d = k_1 \lambda / NA$$

where d is the feature size (d can also be the feature separation), $\lambda$ is the wavelength, NA is the numerical aperture, and k1 is a process constant. Values of k1 as low as 0.1 have been reported when treated as a process constant. In conventional lithography the pitch (feature size +feature separation) may be greater than $0.5\lambda/NA$.

The image formed at the resist consists of the convolution of the (demagnified) image of the mask (or pixel) with the imaging system point spread function. In classical lithography (and microscopy/telescopy) the imaging system point spread function is the Airy disc. The Airy disc produces a small central spot containing most of the power, with very small wings, and it is derived from an imaging system with a clear circular aperture.

One way that features substantially smaller than the wavelength of light can be created is by using not the light to create the features, but rather the dark spaces between light patches. This technique is called darkfield exposure. The obvious drawback of using darkfield to create features is that the minimum separation of features (the pitch) is the width of the bright spots on either side, which are still constrained by the lithographer's equation. In order to use darkfield exposure to create narrow features it is desirable in one exemplary illustrative arrangement to have very sharp edged bright regions (so that they can be placed close together while defining a clear edged dark region). One technique which has been shown to meet this criterion is to use a phase shift mask (PSM) in which the dark features are defined by phase edges. The mask in this case has regions selectively etched (or with phase shift material selectively applied) so that the net phase shift between adjacent regions is 180 degrees. The wavefronts passing through the mask then interfere destructively at the resist in regions corresponding to the lines on the mask marking the boundaries of phase shifted regions. The destructive interference produces a very narrow and sharp edged dark region which is ideal for darkfield exposure. In the literature it has been reported that features as small as ~25 nm have been fabricated using 248 nm light. See M. Fritze, et at, "Sub-100 nm silicon on insulator complimentary metal-oxide semiconductor transistors by deep ultraviolet optical lithography," J. Vac. Sci. Technol. B 18(6) 2886–2890. The features exposed by this technique are necessarily separated by large distances, as explained above.

Programmable Phase Shift Mask with Shape Library

The combination of phase shifting and programmable lithography enables the rapid and convenient exposure of large, complex patterns with a minimum of difficulty, and with a substantial improvement in resolution. As an example (non-limiting) implementation, consider a programmable mask consisting of an array of square shutters with phase shift material applied to them so that the pattern of light and dark at the resist is as shown in FIG. 11.

In order to explain how to place darkfield features closer together than the width of the adjacent bright patches, we need to look closer at how the phase shift mask produces narrow lines.

An exemplary process is illustrated in FIG. 12 (where the plots are approximate, intended only to show major features). This figure shows a cross section through a programmable shutter with phase shift material applied, along with the corresponding amplitude and intensity measured at the resist.

The phase shifting produces an amplitude pattern as in the upper plot of the figure, with a resulting intensity pattern as in the lower plot. Because the resist responds to intensity rather than amplitude, a narrow gap is formed between the peaks. This gap defines the width of the dark field exposed feature. The region outside the intensity pattern also remains unexposed in this example—this will be addressed below.

In one exemplary arrangement, it is desirable that the resist 'remembers' the intensity of the light to which it has been exposed, even though the intensity may not have exceeded the threshold for exposure. Variations on this technique may use advanced resists (i.e., non-integrating photoresists) that do not integrate the total light dose, but for the purposes of this illustrative discussion we restrict ourselves to a simple resist which integrates the total intensity to which it is exposed without regard for the details of exposure timing, etc.

Given an integrating resist and a programmable pixel with a pattern of phase shift material applied to it as in FIG. 12 we can create narrow features with a small pitch by overlapping successive exposures with a small amount of movement between the exposures, as shown in FIG. 13.

From the figure we can see that the overlap of two successive exposures, each one individually below the threshold for the resist, can create darkfield exposed features that are closer together than would be allowed by the lithographers' equation. As in FIG. 12 we have regions outside the exposed area in which the resist is unexposed. Because the features are defined by the dark regions the resist outside will have to be exposed separately in order to ensure that we only have the two features we want.

We now have all of the elements needed to create a pattern of densely packed small features on the resist. The exemplary shapes shown in FIG. 11 allow us to create a network of interconnects and pads needed to pattern an entire wafer. We can space lines closely by using the overlap technique, and we can connect lines by butting shutter exposures up against one another. Where the unexposed resist does not contain any features we can use the small solid shape to fill in the gaps between features. In order to implement this we need a programmable mask with phase shift material on the pixels, with some pixels having material applied in such a way as to generate each of the patterns in FIG. 11, along with any other patterns that might by useful, such as smooth curves or pads with leads.

In order to create the desired pattern on the resist the pattern must first be analyzed and broken down into a set of discrete exposures suitable for application by either overlapping or by abutting shutter patterns. Because the edges of the shutter intensity patterns are not sharp, but rather smoothly go to zero, butting shutter exposures together potentially presents some problems. The total intensity when two shutter exposures are adjacent is ideally flat at the transition region. This will not necessarily be realized in practice. For this reason one of the shutter shapes should be a simple small shape with no darkfield features. This shutter shape can then be used to smooth out the boundary region between shutter exposures. In addition this shape can be used to locally enhance the energy deposited in a given region, either to delineate a shape not already on a shutter, or to make fine adjustments in the shape projected by another shutter.

Example Variations

There are many variations on the technique presented above. The shape library need not be placed directly on the shutter. The phase shift material that creates the shapes could be placed on a diffraction limiting mask near the wafer, or on a separate mask close to the shutters, or at some other location within the optical train. Separating the phase shift material from the shutter itself makes it simpler to use a micromirror array. In addition separating the phase shift material from the shutters permits greater flexibility in that it permits custom shape library phase shift submasks to be used depending on the particular type of pattern being exposed. Different phase shift submasks may be needed because the shapes being exposed are different, or simply for process optimization, in which case the number of any given shape may vary from mask to mask, even though all shapes are present on both submasks. This allows for phase shift submasks to be selected based on which will give the greatest throughput.

The shapes in the phase shift submask library need not be those intended to be present in the final resist pattern. They may be selected so that they give the greatest flexibility when overlapped, or so that the overlap of certain shutter exposures produces desirable resist patterns. This is one possible technique for reducing the number of elements needed in the phase shift shape library, while maintaining the ability to expose the desired pattern.

Programmable Phase Shift Shutters

It is well known that there are certain materials whose refractive index depends on the applied electric field, either linearly (Pockels effect) or quadraticaly (Kerr effect). In such materials, an applied electric field modifies the manner in which light interacts with the material, so that the light passes through the material either slower or faster than it would without the applied electric field. In the case of a linear material the refractive index varies as $$n(E) = n_0 + a \cdot E$$

where E is the applied electric field. The coefficient a is typically very small, but this can be compensated by making E large. In the case of a quadratic material we have $$n(E) = n_0 + b \cdot E^2$$

where again the coefficient b is very small.

One illustrative arrangement places an electro-optic material (EOM) on each shutter of a programmable mask, along with electrical contacts to apply an electric field individually to the material on each shutter. The phase shift material may be used in two ways, either in a homogeneous mode (a uniform field applied across the whole of the EOM) or in an inhomogeneous mode (in which the field is non-uniform across the EOM).

Where the phase-shifting is done homogeneously, it can be used to compensate for interference between the light distributions of adjacent shutters in a manner analogous to the way PSMs are used in conventional lithography. In this case the phase-shifting is electronically controlled, so it may be used only where it is helpful. Since the programmable mask will have different shutters open at different times, the most desirable phase-shift pattern will vary depending on the pattern of shutters open and closed. Homogenous programmable phase shifting allows the phase shift pattern to be intelligently programmed to give the best results based on the particular pattern being exposed at the time.

In the case where the programmable phase shift is done inhomogeneously, the effect is to either focus or defocus the light from the shutter. In this case the advantage conveyed by the programmable phase shift is in control over the detailed shape and width of the single shutter intensity profile. In conjunction with the advanced exposure techniques described elsewhere, this provides additional flexibility, and therefore a greater degree of control over the exposure dose at the resist. Control of the single shutter intensity profile provides an additional degree of freedom which may be exploited to improve resolution, throughput, or both.

Homogeneous Phase-Shifting

Homogeneous phase-shifting corrects for the effects of overlapping nearby shutter intensity profiles, or enables the overlap to be used to create pattern elements.

From exemplary non-limiting FIG. 14 it is clear that the light intensity in the overlap region is substantially modified by phase shifting one pixel relative to another. The overlap region can be either exposed or not exposed, depending on whether the phase shift material is active or not. This application of homogeneous phase shifting allows for adjustment of exposure in the overlap region, effectively creating a 'virtual shutter' covering only the overlap region. Additionally, in the case where the overlap is between pixels which are more widely separated (not just adjacent pixels), the programmable phase shift permits us to correct for proximity effects based on the exact pattern of pixels which are on or off for any given exposure. In this second case the programmable phase shifting is used to correct for potentially undesirable effects of pixel overlap.

Inhomogeneous Phase-Shift

Inhomogeneous phase-shift allows the intensity profile of a single shutter to be individually adjusted, either to steepen the sides or to make the sides of the pattern less steep. This permits greater flexibility in the application of advanced exposure techniques.

In FIG. 15, the exemplary intensity pattern is less steep-sided with the phase-shifter active, but this need not be the case—the two intensity patterns could be reversed if that turned out to be more convenient. In addition, since the electro-optic effect depends on the applied field, we can vary the degree of modification of the intensity pattern by adjusting the magnitude of the applied field, further increasing the flexibility of the system.

The exemplary inhomogeneous effect shown in FIG. 15 can be achieved either with a nonuniform electric field, or with nonuniform application of EOM to the pixel, or by allowing the physical properties of the EOM to vary over the area of the pixel.

Other exemplary arrangements can provide the phase shift elements in a structure that is physically separate from or integrated with the programmable mask. For example, the phase shift elements might comprise a separate plate or other structure defining an array of programmable or non-programmable (i.e., fixed refraction index) phase shift elements, or the phase shift elements and the pixels of the programmable mask can be integrated into a common structure. In one illustrative arrangement, the phase shifting structure comprises an array of phase shift elements in registry with and having correspondence (e.g., one-to-one or other correspondence) with pixel elements of a programmable mask. The phase shift elements can have fixed or programmable phase shifts. Fixed or programmable phase shifts might for example provide a "checkerboard" pattern of alternating phase shift amounts (e.g., a certain angle A, and A±180 degrees). In the case of a programmable array, the particular phase shifts being applied by particular phase shift elements in the array can be changed by applying a stimulus such as an electric field, a voltage, a current, magnetic stimulus, etc.

Sub Wavelength Pixel Images by Apodization

The image formed at the resist consists of the convolution of the (demagnified) image of the mask (or pixel) with the imaging system point spread function. In classical lithography (and microscopy/telescopy) the imaging system point spread function is the Airy disc. The Airy disc produces a small central spot containing most of the power, with very small wings, and it is derived from an imaging system with a clear circular aperture.

If we apply material to the limiting aperture which modifies the phase and amplitude of the incoming light we can reduce the size of the central spot, which can come at the cost of reducing the energy in the central spot and creating larger wings (e.g., there is a redistribution of energy from the central spot to the sidelobes). The apodization function is the phase and amplitude modulation at the limiting aperture, and it is this apodization which allows superresolution for a finite field at the image plane. In this finite field the point spread function can be substantially smaller than the Airy function and in certain cases can be approximated by a delta function. This technique has been discussed in detail by Frieden (Frieden, B. Roy, "On arbitrarily perfect imagery with a finite aperture," *Optica Acta*, Vol. 16, pp. 795–807, 1969) for the specific cases of microscopy and telescopy.

In the Fraunhofer approximation (low Numerical Aperture, NA) the point spread function a(x) is related to the optical pupil function U(β) through a Fourier transform:

$$a(x) = \int_{-\beta_0}^{\beta_0} d\beta U(\beta) \exp(j\beta x)$$

where x is the radial coordinate at the image plane and $\beta = 2\pi/\lambda R \times$ pupil radial coordinate. The R is the image distance (focal length in the case of parallel incoming rays). Note that the Fourier transform in question is not the conventional one in which the integral extends from ±∞, but rather a finite Fourier transform. The desired ideal point spread function (a delta function) with a limited field is expanded in a series of prolate spheroidal wave functions. These functions have the useful property of being their own finite Fourier transform, and of forming a complete orthogonal set over a finite field.

Exemplary Apodization Method

To derive the desired pupil function, we first select the desired finite field at the image plane over which we wish to approximate a delta function. For the purposes of programmable lithography this field need not be particularly large, since we can eliminate light outside the field with a diffraction limiter or we can use a non-integrating resist such as a two-photon resist with light of the second wavelength concentrated inside the field.

The technique described here expands the desired point spread function in terms of normalized "angular functions" given by $$\Psi_n(x) = (\lambda_n/N_n)^{1/2} S_{0n}(c, x/x_0)$$

where $\lambda_n$ is the eigenvalue corresponding to the function $S_{0n}$, and $x_0$ is the radius of the field, $c = \beta_0 x_0$ and $$N_n = \int_{-1}^{1} dt [S_{0n}(c, t)]^2$$

The point spread function is given by $$a(x) = \sum_{n=0}^{\infty} \lambda_n^{-1} \psi_n(0) \psi_n(x)$$

And the corresponding pupil function is $$U(\beta) = (x_0/2\pi\beta_0)^{1/2} \sum_{n=0}^{\infty} j^n \lambda_n^{-1} \psi_n(0) \psi_n(\beta x/\beta_0)$$

In practice we can't sum to infinity, so the sum should be truncated at some point. Where we choose to truncate will dictate how wide the central peak is, and how much power is lost.

An example illustrative apodized point spread function is shown in FIG. 16. This function is probably unsuitable for use in most lithography due to the large sidelobes (larger than the central peak). This apodization was produced for a 3 cm aperture radius, 10 cm focal length, i-line illumination, and $x_0 = \lambda/2$.

In order to control the sidelobes we can either apply an additional apodization, modify the apodization we already have, or use a diffraction limiting mask close to the resist (but not necessarily in contact). If we choose to use a diffraction limiting secondary mask, we can have a standoff distance on the order of a wavelength or so, unlike the case of a diffraction limiter used with an unapodized imaging system.

The point spread function of example FIG. 16 can be improved if we multiply it by a gaussian transmission function, the result of which is shown in FIG. 17. The gaussian is wide enough that it should be possible to implement it in the apodization. One possibility is to take advantage of the fact that Fourier space multiplication is real space convolution and vice versa, in which case the net apodization should be the convolution of the apodizing pupil function that generates FIG. 16 with the fourier transform of the desired gaussian.

Exemplary Implementation (Lithography)

The apodization techniques known in the literature (see Frieden) are generally used in purely imaging systems, i.e., systems that capture as opposed to projecting an image. In the case of programmable lithography, however, we have substantially complete control over the object being imaged onto the resist (namely the pixel). It is very likely that proper shaping of the pixel will allow for improvements in or reduce the side effects from the apodizing aperture. It may be possible to apply phase shift material and opaque material directly to the pixel itself in place of the apodizing aperture. In this concept, the pixel itself effectively becomes the apodizing aperture.

An exemplary apodization function that produces the exemplary FIG. 16 behavior is shown in FIG. 18 and FIG. 19. It is clear from the figures that approximating the function using a stepped approximation will probably introduce errors.

The phase shift can be introduced with varying thicknesses of material with a high index of refraction, such as quartz. The opacity can be implemented by applying layers of semi-opaque material in various thicknesses.

Example Implementation (Metrology)

In order to implement an apodized imaging system for metrology, we can take one of several approaches. For example, we can apodize the imaging system or we can create an apodized projection system which projects a substantially sub-wavelength spot onto the wafer or mask being imaged, and the spot is scanned to image the whole object.

In the case of an apodized imaging system, we choose the apodizing function to create a narrow central distribution with a flat region on either side. The size of this flat region dictates the maximum size of the region on the object that can be imaged at any one time. The sensor used to detect the image (for example a CCD) need be no larger than the size of this flat region. In order to image the whole of the object the imaging system must be scanned relative to the object, unless the object is so small that it fits entirely within the flat region. One possible improvement is to implement the metrology system as a series of parallel imaging systems. The individual optical columns can each have their own apodized pupil and CCD so that large wafers can be imaged efficiently.

In the case of an apodized illumination source, the source optics are apodized to produce a small (substantially sub-wavelength) spot. This spot can be scanned so as to build up a rasterized image of the object. The scattered light from the scanning spot can be detected by a CCD or other imaging device. This technique would be similar to confocal microscopy.

Example Implementation to Expose Semiconductor Wafers

Any or all of the above techniques can be used in programmable lithography using steppers or other known apparatus to expose semiconductor wafers. For example, one type of lithography that is commonly used in the mass production of computer chips is known as "parallel lithography". Parallel lithography generally prints an entire pattern (or a significant portion of a pattern) at one time. This is usually accomplished by projecting photons through a mask onto a photoresist-coated semiconductor wafer. The mask provides a template of the desired circuit. A photoresist coat, which may be a thin layer of material coated on the wafer which changes its chemical properties when impinged upon by light, is used to translate or transfer the mask template onto the semiconductor wafer. The mask allows photons (e.g., incident light) to pass through the areas defining the features but not through other areas. An example of a typical mask construction would be deposits of metal on a glass substrate. In a way analogous to the way light coming through a photographic negative exposes photographic paper, light coming through the mask exposes the photoresist. The exposed photoresist bearing the pattern selectively "resists" a further process (e.g., etching with acid, bombardment with various particles, deposition of a metallic or other layer, etc.) Thus, this lithography technique using photoresist can be used to effectively translate the pattern defined by the mask into a structural pattern on the semiconductor wafer. By repeating this technique several times on the same wafer using different masks, it is possible to build multi-layered semiconductor structures (e.g., transistors) and associated interconnecting electrical circuits.

For mass production, parallel lithography is usually done using a machine known as a "stepper." Generally, a stepper consists of a light source, a place to hold a mask, an optical system for projecting and demagnifying the image of the mask onto a photoresist-coated wafer, and a stage to move the wafer. In each exposure, a stepper only exposes a small part of the wafer, generally the size of one chip. Since there are often many separate chips on each wafer, the wafer must be exposed many times. The stepper exposes the first chip, then moves ("steps") over to expose the next chip and repeats this process until the entire wafer is exposed. This process is known as "step and repeat" and is the origin of the name "stepper."

A stepper is generally capable of precisely positioning the wafer relative to the mask. This precise positioning (overlay accuracy) is needed because each lithography step must line up with the previous layer of lithography. A stepper spends a significant portion of its time positioning the stage and the rest exposing the photoresist. Despite the great precision necessary, steppers are also capable of high throughput to be useful for mass production. For example, there are steppers that can process one-hundred 8-inch wafers per hour.

One way to increase the usefulness of a chip is to increase its size. In the "step and repeat" example described above, the size of the chip is limited to the exposure size of the stepper. The exposure size is small (roughly 20 mm×40 mm) because of the cost of an optical system that is capable of projecting a high quality image of the mask onto the wafer. It is very expensive to increase the size of a chip by increasing the exposure size of the stepper (for example, this would require larger lenses—which by themselves can cost millions of dollars). Another approach is to modify a stepper so that light only shines on a subsection of the mask at a given time. Then, the mask and wafer can be scanned (moved relative to the fixed light source) simultaneously until the entire mask is imaged onto the wafer. This modified stepper is known as a "scanner" or "scanner/stepper". The scanner serves to disconnect the exposure size from the chip size.

Scanners offer increased chip size at the expense of increased complexity and mask costs. Because scanner masks are larger, the masks are more fragile and are more likely to contain a defect. The increased size and fragility of the mask mean that the masks for a scanner will be more expensive than the masks for a stepper. Also, because the image is being demagnified, the mask and wafer must be scanned at different speeds. Because of the great precision required, differential scanning increases the cost and complexity of a scanner when compared with a stepper.

Many chip manufacturers are looking toward future improvements in resolution and/or exposure size to help continue the growth that has driven the semiconductor industry for the past thirty years. Improvements in these areas have been partly the result of improvements in the optical systems used to demagnify the mask and of the use of shorter wavelength light. In particular, modern lithography systems used for mass production are "diffraction limited", meaning that the smallest feature size that it is possible to print is determined by the diffraction of light and not by the size of features on the mask. In order to improve the resolution, one must use either a shorter wavelength of light or other techniques such as optical proximity correction or phase shifting. The wavelength used in leading edge lithography has shifted from 436 nm to 365 nm to 248 nm to 193 nm and is expected to move to 157 nm in the future. There is also considerable efforts to move to much shorter wavelengths such as EUV (13 nm) and x-rays (1 nm). Additionally there are research efforts to use other forms of radiation such as electron (SCALPEL and EPL) and ions (IPL) which have still shorter wavelengths.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the scope of the appended claims.

We claim:

1. A method for decomposing a desired resist exposure pattern and using the decomposed pattern to perform programmable lithography comprising:
   expressing the desired resist exposure pattern in vector form;
   expressing the relationship between the shutter energies and the resulting total energy delivered to the various regions of the resist as a matrix;
   calculating the inverse or pseudo-inverse of said matrix;
   applying said inverse or pseudo-inverse to the desire resist exposure pattern in vector form, so as to generate a vector representing the shutter exposure energies;
   programming a mask using said generated shutter exposure energy vector; and
   passing electromagnetic energy through said programmed mask to expose a substrate having resist disposed thereon.

2. A method as in claim 1 further including modifying the results of the initial calculation according to physical realizability.

3. A system for exposing a substrate comprising:
   a source of illuminating radiation;
   a programmable mask disposed between said source and a substrate to be exposed, said programmable mask comprising a two-dimensional array of electrically controllable optical elements;
   a computer coupled to at least said programmable mask, said computer providing a pattern decomposition process that expresses a desired resist exposure pattern in vector form, expresses the relationship between the energies within said programmable mask elements and the resulting total energy delivered to the various regions of the substrate as a matrix, and calculates the pseudo-inverse of said matrix in order to apply the results of said calculation to control the exposure energies by which said elements expose said substrate.

4. A method of decomposing an exposure pattern comprising:
   constructing a first shutter-grid map matrix;
   inverting said matrix and building a desired grid exposure vector G therefrom;
   finding the required shutter energy vector E from said vector G;
   testing said energy vector S for physical realizability;
   if said energy vector E is not physically realizable, constructing a new grid exposure vector G'; and
   iterating said above steps in the event that said testing step reveals said energy vector E is not physically realizable.

* * * * *

UNITED STATES PATENT AND TRADEMARK OFFICE
CERTIFICATE OF CORRECTION

| | | |
|---|---|---|
| PATENT NO. | : 7,050,155 B2 | |
| APPLICATION NO. | : 10/283322 | |
| DATED | : May 23, 2006 | |
| INVENTOR(S) | : Case et al. | |

It is certified that error appears in the above-identified patent and that said Letters Patent is hereby corrected as shown below:

The title page should be deleted and substitute therefor the attached title page.

Drawings:

The drawing sheets for Figs. 1, 2, 3, 4, 5, 10, 11, 12, 14, and 15 of 19 should be deleted and substitute therefor drawing Figs 1-15 as shown on the attached pages.

Signed and Sealed this

Twenty-second Day of January, 2008

JON W. DUDAS
*Director of the United States Patent and Trademark Office*

United States Patent
Case et al.

(10) Patent No.: US 7,050,155 B2
(45) Date of Patent: May 23, 2006

(54) ADVANCED EXPOSURE TECHNIQUES FOR PROGRAMMABLE LITHOGRAPHY

(75) Inventors: Andrew Case, Silver Springs, MD (US); Gregory D. Cooper, Alexandria, VA (US); Erin Fleet, Alexandria, VA (US)

(73) Assignee: Pixelligent Technologies LLC, College Park, MD (US)

( * ) Notice: Subject to any disclaimer, the term of this patent is extended or adjusted under 35 U.S.C. 154(b) by 150 days.

(21) Appl. No.: 10/283,322

(22) Filed: Oct. 30, 2002

(65) Prior Publication Data
US 2003/0128347 A1 Jul. 10, 2003

Related U.S. Application Data

(60) Provisional application No. 60/331,515, filed on Nov. 19, 2001, provisional application No. 60/331,039, filed on Nov. 7, 2001, provisional application No. 60/331,038, filed on Nov. 7, 2001, provisional application No. 60/330,765, filed on Oct. 30, 2001, provisional application No. 60/330,745, filed on Oct. 30, 2001.

(51) Int. Cl.
*G03B 27/32* (2006.01)
*G03B 27/42* (2006.01)
*G03B 27/54* (2006.01)

(52) U.S. Cl. .................... 355/77; 355/53; 355/67
(58) Field of Classification Search ............... 355/53, 355/77, 67; 430/5, 22, 311, 321
See application file for complete search history.

(56) References Cited

U.S. PATENT DOCUMENTS

| | | | |
|---|---|---|---|
| 5,418,598 A | 5/1995 | Fukuda et al. | |
| 5,467,166 A | 11/1995 | Shiraishi | |
| 5,527,645 A | 6/1996 | Pati et al. | |
| 5,998,069 A | 12/1999 | Cutter et al. | |
| 6,261,728 B1 | 7/2001 | Lin | |
| 6,291,110 B1 | 9/2001 | Cooper et al. | |
| 6,489,984 B1 | 12/2002 | Johnson | |
| 6,879,376 B1* | 4/2005 | Case et al. | 355/53 |
| 2005/0036783 A1* | 2/2005 | Mortia et al. | 396/611 |

* cited by examiner

*Primary Examiner*—Rodney Fuller
(74) *Attorney, Agent, or Firm*—Nixon & Vanderhye P.C.

(57) ABSTRACT

Advanced techniques for programmable photolithography provide enhanced resolution and other aspects of a photolithography system. The pseudo-inverse of a matrix is applied to the results of a calculation to control exposure energies.

4 Claims, 19 Drawing Sheets

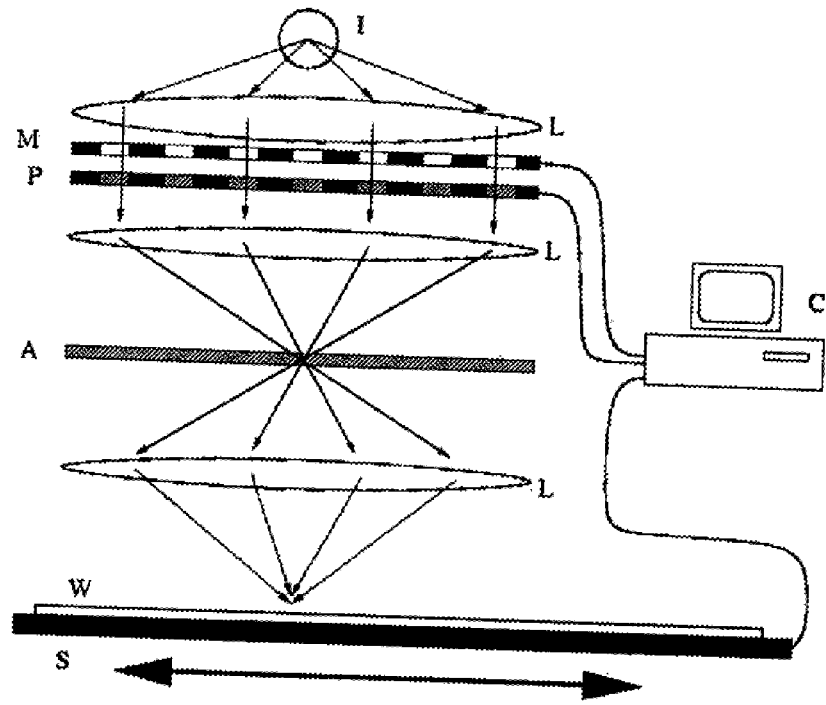

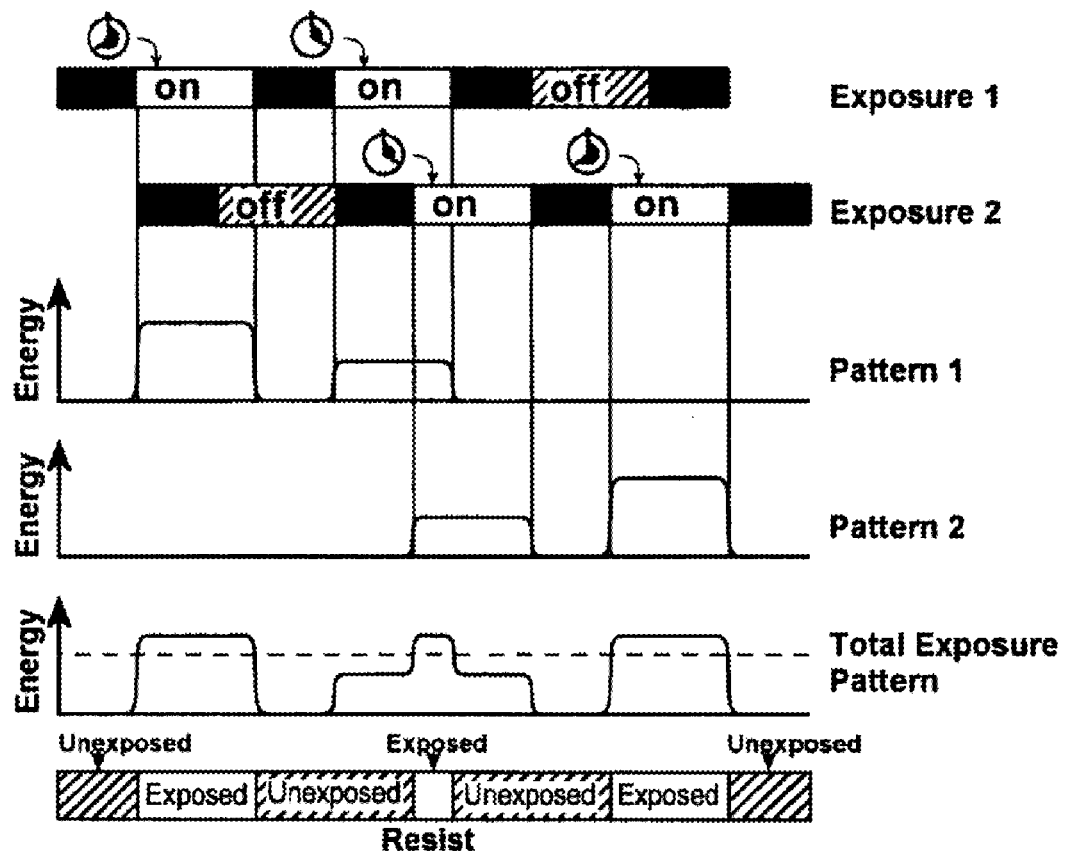
Figure 1 Example Sub-Pixel resolution by exposure overlap

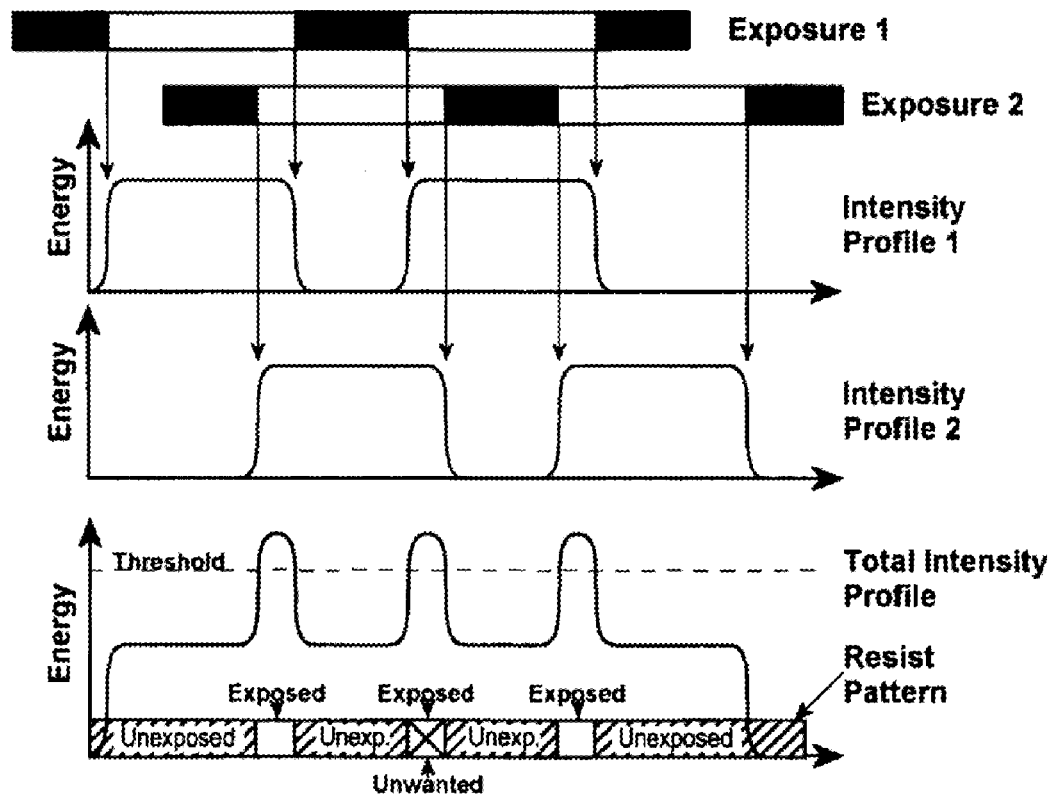
Figure 2 Example Unwanted overlap of single shutter exposure patterns

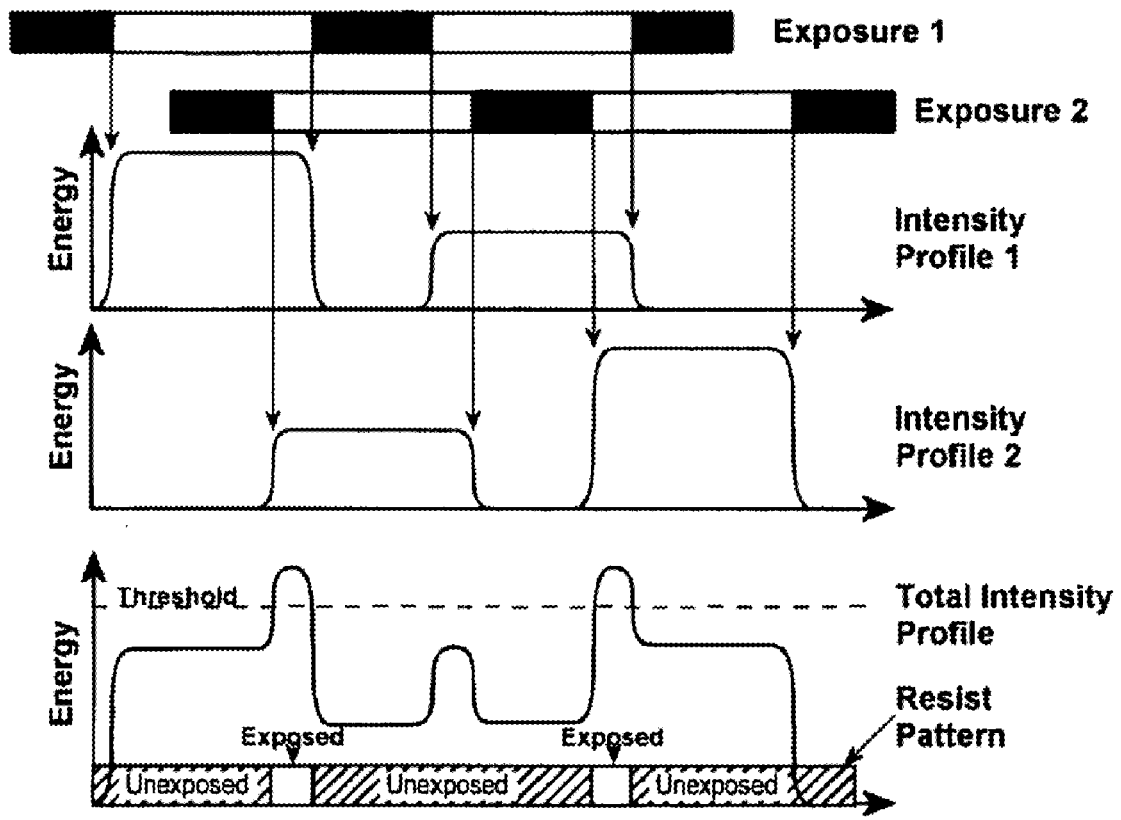
Figure 3 Example Application of timing control to preventing unwanted features

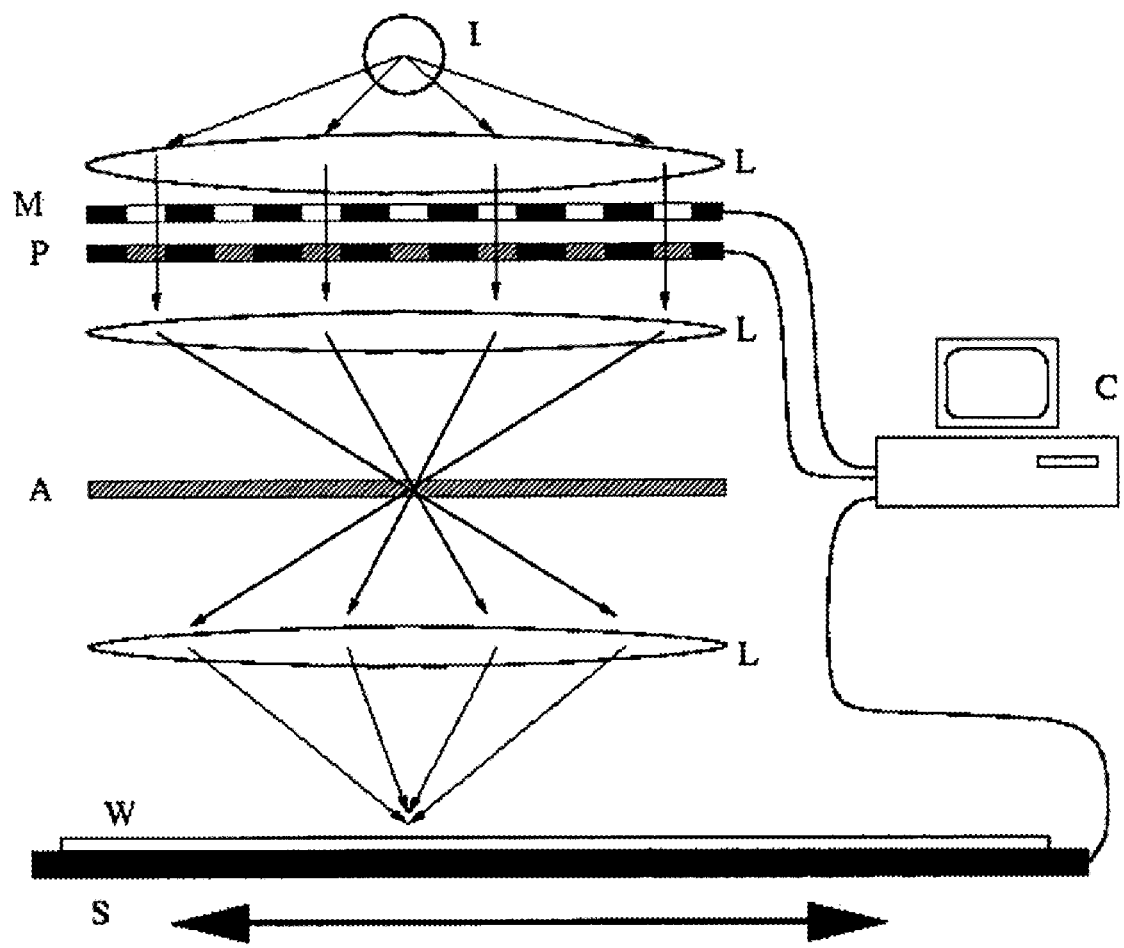
Figure 4 Example stepper system

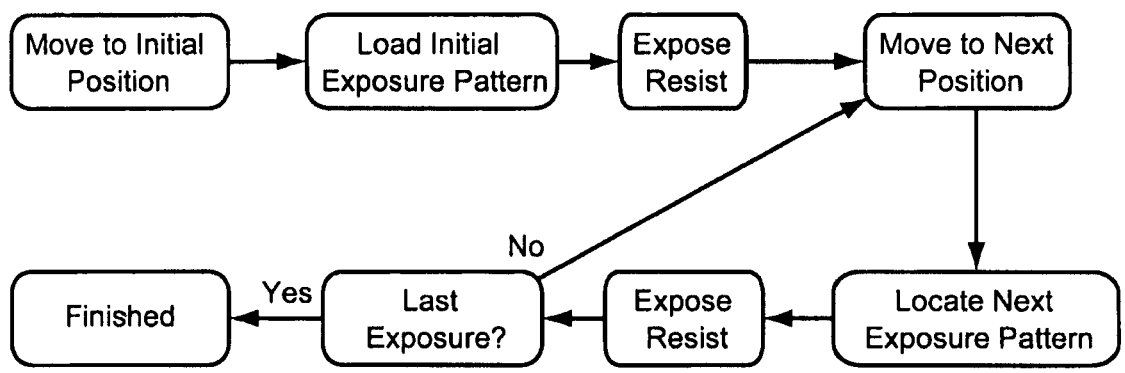
Figure 5 Flowchart of example process used to form resist pattern using multiple exposures and movement of substrate relative to mask

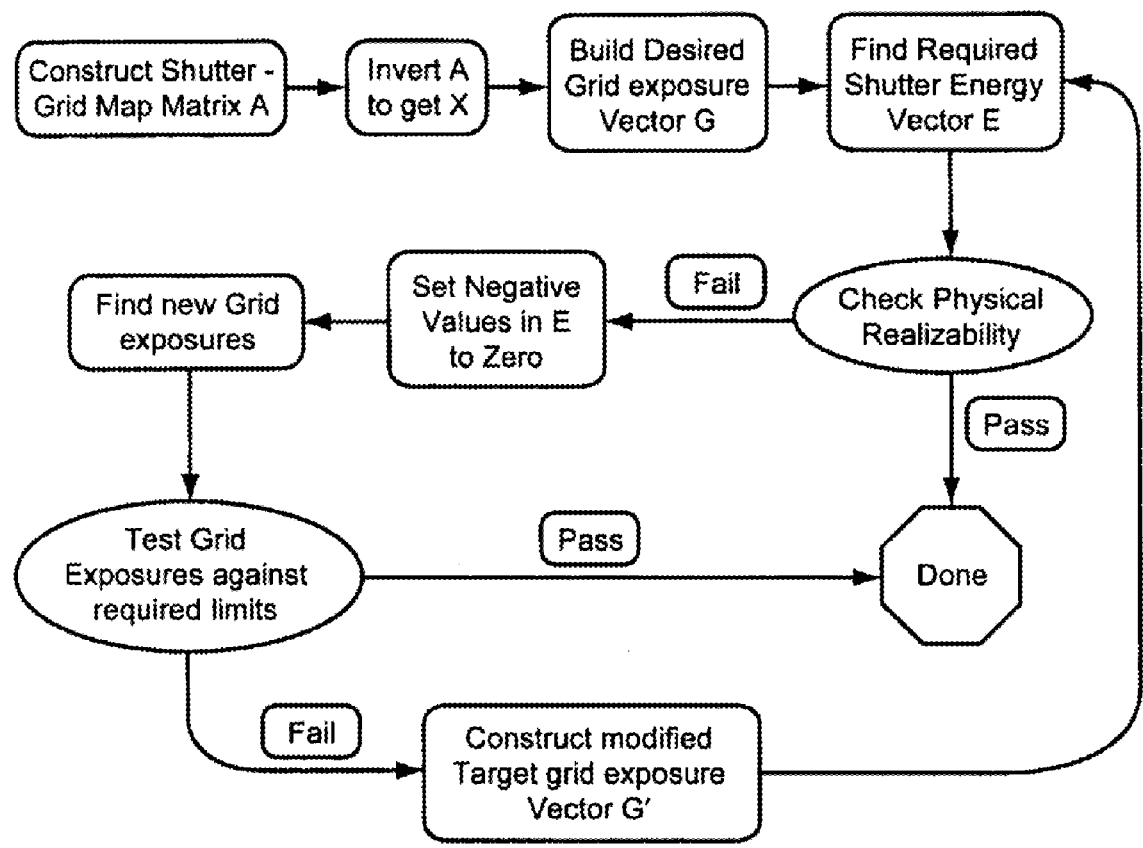
Figure 9A: Exemplary Flowchart

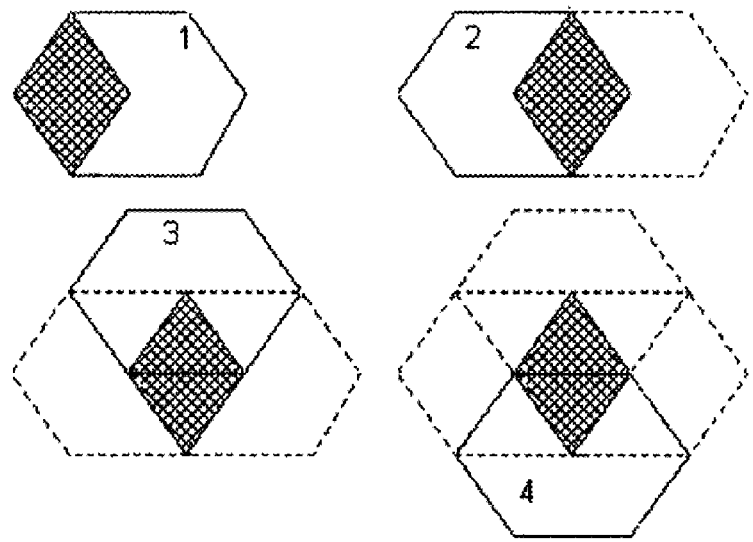
Figure 10 Example Diamond Shaped Grid Units built from Hexagonal Shutters
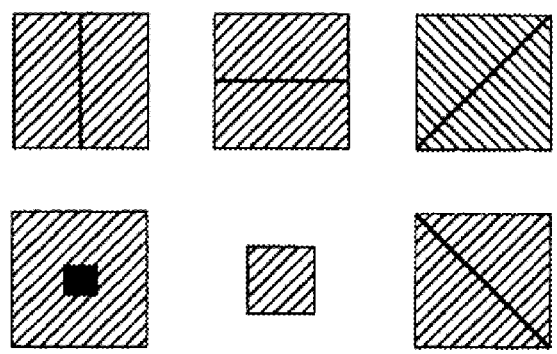
Figure 11 Example Programmable Phase Shift Mask shape library
(Blue is bright patches, black is dark; the patterns are on the photoresist).

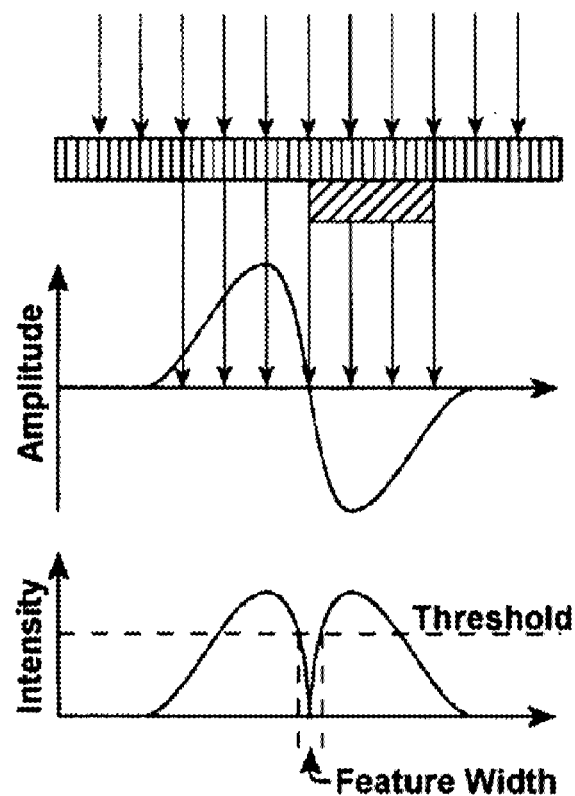
Figure 12 Example creation of narrow features with dark field exposure and phase shifting.

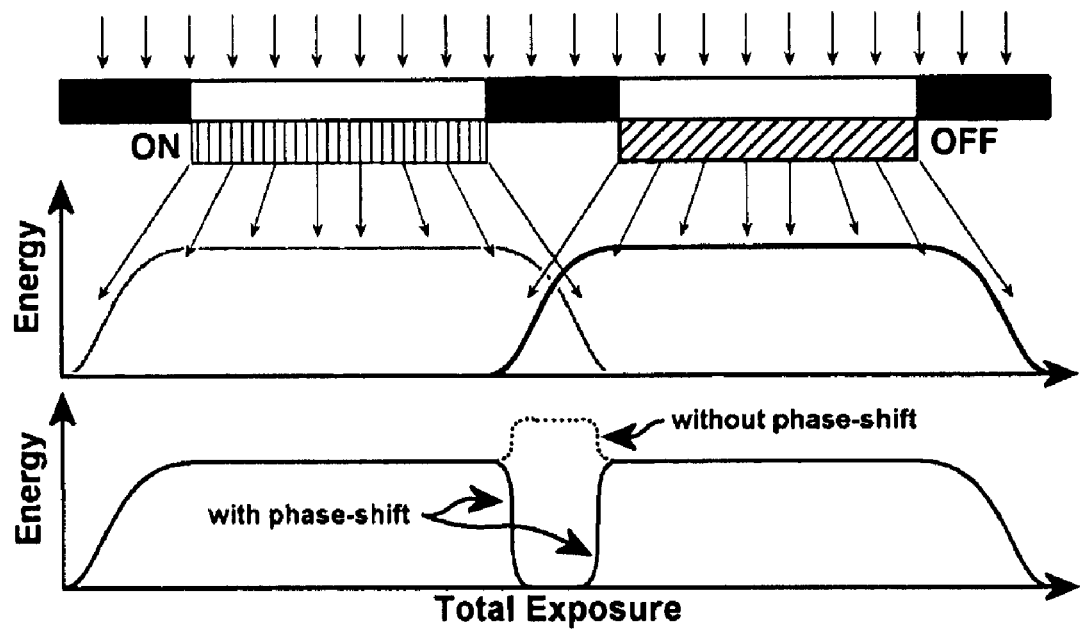
Figure 14 Example Homogeneous programmable phase shifting to adjust the interaction between shutters

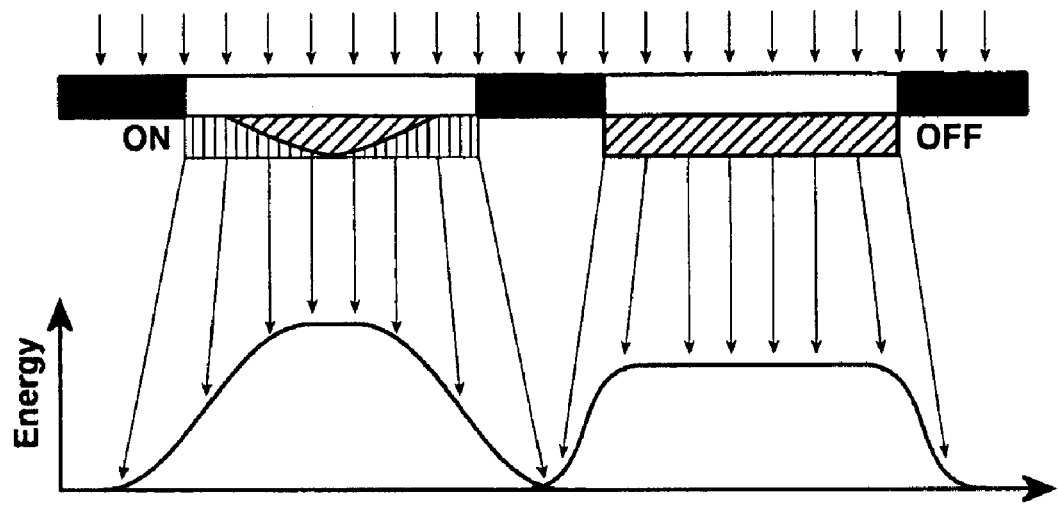
Figure 15  Example Use of Inhomogeneous phase-shifting to adjust individual shutter intensity profiles